(12) United States Patent
Yamada et al.

(10) Patent No.: US 8,597,457 B2
(45) Date of Patent: Dec. 3, 2013

(54) BONDING METHOD FOR LAMINATED PIEZOELECTRIC ELEMENT

(75) Inventors: Tsukasa Yamada, Sagamihara (JP); Toyoki Tanaka, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 1121 days.

(21) Appl. No.: 12/070,517

(22) Filed: Feb. 19, 2008

(65) Prior Publication Data

US 2008/0196815 A1 Aug. 21, 2008

(30) Foreign Application Priority Data

Feb. 20, 2007 (JP) ................................. 2007-038855

(51) Int. Cl.
*H01L 41/22* (2013.01)
*H01L 41/083* (2006.01)

(52) U.S. Cl.
USPC ........................................................ 156/256

(58) Field of Classification Search
USPC .................................................. 156/60, 256
See application file for complete search history.

(56) References Cited

U.S. PATENT DOCUMENTS

| 5,225,941 A | 7/1993 | Saito et al. |
| 5,561,337 A | 10/1996 | Toda |
| 5,589,723 A | 12/1996 | Yoshida et al. |
| 2005/0269910 A1 * | 12/2005 | Homma ........................ 310/348 |
| 2007/0075608 A1 * | 4/2007 | Yuasa et al. ............... 310/323.13 |

FOREIGN PATENT DOCUMENTS

| EP | 0576037 A2 * | 12/1993 |
| JP | 4-105374 A | 4/1992 |
| JP | 6-188472 A | 7/1994 |
| JP | 06-265378 A | 9/1994 |
| JP | 2633066 B2 | 4/1997 |
| JP | 11-91113 A * | 4/1999 |
| JP | 3218851 B2 | 8/2001 |
| JP | 2002-247868 A | 8/2002 |
| JP | 2006-184565 A | 7/2006 |
| JP | 2006-286774 A | 10/2006 |

OTHER PUBLICATIONS

Machine translation of 06-188472, date unknown.*
Machine Translation of JP 11-91113, date unknown.*
European Office Action dated Oct. 8, 2010 (in English) in counterpart European Application No. 08101758.4.
Extended European Search Report dated Jul. 16, 2008 issued in counterpart European Appln. No. 08101758.4.
Japanese Office Action dated Feb. 1, 2012 (and English translation of the Relevant Part thereof) in counterpart Japanese Application No. 2007-038855.

* cited by examiner

*Primary Examiner* — Jeff Aftergut
(74) *Attorney, Agent, or Firm* — Holtz, Holtz, Goodman & Chick, PC

(57) ABSTRACT

A laminated piezoelectric element includes plural internal electrodes which are laminated and a dead area at outer regions thereof. The laminated piezoelectric element has first and second end surfaces in an expansion direction thereof. In bonding a first bonded surface of a piezoelectric element fixing portion to the first end surface, a bonding method includes forming a first adhesive accumulation in the first bonded surface, accumulating an adhesive agent in the first adhesive accumulation, and bonding the first end surface to the first bonded surface. In bonding a vibration friction element to the second end surface, the bonding method includes forming, in a second bonded surface of the vibration friction element, a positioning guide hole for guiding the second end surface of the laminated piezoelectric element and a second adhesive accumulation, accumulating the adhesive agent in the second adhesive accumulation, and bonding the second end surface to the vibration friction portion.

3 Claims, 21 Drawing Sheets

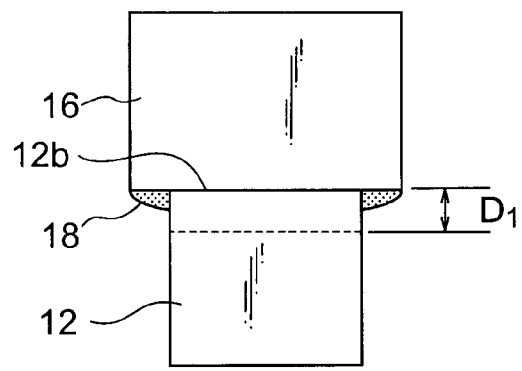 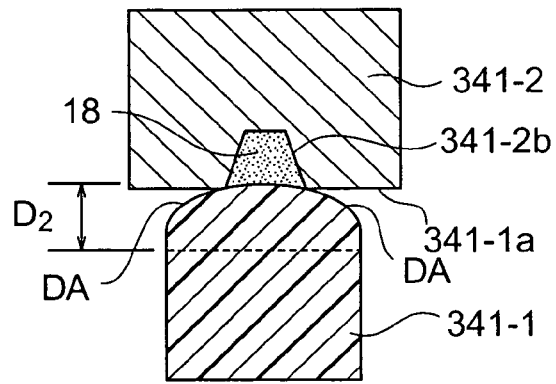
FIG. 21A
(RELATED ART)
FIG. 21B

BONDING METHOD FOR LAMINATED PIEZOELECTRIC ELEMENT

This application is based upon and claims the benefit of priority from Japanese Patent Application JP 2007-38855, filed on Feb. 20, 2007, the disclosure of which is incorporated herein in its entirety by reference.

BACKGROUND OF THE INVENTION

This invention relates to a linear actuator and, in particular, to a bonding method for a laminated piezoelectric element which is used as a driving source of the linear actuator.

Previously, linear actuators using piezoelectric elements are used as auto-focus actuators or zoom actuators for use in cameras.

By way of illustration, Japanese Patent No. 2633066 (JP-B 2633066) (which will be also called a first patent document), which corresponds to U.S. Pat. No. 5,225,941, discloses a driving device comprising a driving rod frictionally engaged with a lens barrel, a piezoelectric element disposed in contact with the driving rod, and a leaf spring for bringing the driving rod into frictional engagement with the lens barrel. That is, the driving rod is bonded to an end of the piezoelectric element in an expansion direction. The lens barrel is movably supported to the driving rod. The leaf spring produces friction between the driving rod and the lens barrel. In the driving device disclosed in JP-B 2633066, a voltage is applied to the piezoelectric element so as to make a speed of expansion of the piezoelectric element different from a speed of contraction thereof.

In addition, Japanese Patent No. 3218851 (JP-B 3218851) (which will be also called a second patent document), which corresponds to U.S. Pat. No. 5,589,723, discloses a driving apparatus comprising a piezoelectric element, a driving shaft, coupled to the piezoelectric element, for extending in an expansion direction of the piezoelectric element, and a driven member (a lens barrel) frictionally coupled to the driving shaft. The driving apparatus in JP-B 3218851 drives the lens barrel by devising a driving signal applied to the piezoelectric element.

Furthermore, Japanese Unexamined Patent Application Publication NO. 2006-184565 (JP-A 2006-184565) (which will be also called a third patent document) discloses an optical module which is miniaturized and which can improve the positional accuracy of a lens holder. The optical module comprises the lens holder for holding lenses, a lens holder supporting body, a plurality of piezoelectric elements disposed rotationally symmetric about an optical axis of the lenses, and a plurality of weights which are coupled to the piezoelectric elements and which are disposed rotationally symmetric about the optical axis of the lenses. The lens holder is movable in the optical direction of the lenses. The lens holder supporting body comprises a cylinder portion therein and slidably supports the lens holder in an inner surface of the cylinder portion in the optical direction of the lenses. In addition, the lens holder supporting body holds the lens holder at an arbitrary potion in the optical direction of the lenses by means of static frictional force generated between the inner surface of the cylinder portion and an outer surface of the lens holder. A voltage is applied to the plurality of piezoelectric elements so as to make the speed of expansion thereof different from the speed of contraction thereof, thereby the piezoelectric elements expand and contract in the optical direction of the lenses. In addition, the plurality of piezoelectric elements have one surfaces in the expansion direction that are fixed to a surface of the lens holder at one end portion in the optical axis of the lenses. The plurality of weights are fixed to other surfaces of the piezoelectric elements in an expansion direction thereof.

At any rate, the optical module disclosed in JP-A 2006-184565 moves the lens holder by means of an "inertial force" of the weights generated by expansion and contraction of the piezoelectric elements. As the piezoelectric element, a laminated piezoelectric element where a plurality of piezoelectric layers (internal electrodes) are laminated is used. In JP-A2006-184565, the piezoelectric element has one end fixed to the lens holder (a movable portion) and another end fixed to the weights. That is, a combination of the piezoelectric elements, the lens holder, and the weights composes a lens unit. The lens unit is slidably supported by the lens holder supporting body in the optical direction of the lenses. In addition, in JP-A 2006-184565, each weight has another end which is fixed to no body and therefore the piezoelectric elements and the weights are put into a hung state where they are hung down over the lens holder (the movable portion).

In the above-mentioned first through third patent documents, in the manner which will be described in conjunction with FIG. 1, the piezoelectric element has upper and lower surfaces in the expansion direction that are uniformly bonded to a housing (a supporting member, a supporting plate, a weight fixing member) or a driving object (the driving rod, the driving shaft, the lens holder) via an adhesive agent. Herein, the housing and the driving subject will be collectively called bonded objects.

However, a related bonding method is disadvantageous in that a piezoelectric efficiency is decreased and it is in danger of stripping the adhesive agent.

SUMMARY OF THE INVENTION

It is therefore an exemplary object of the present invention to provide a bonding method for a laminated piezoelectric element which is capable of suppressing reduction of a piezoelectric efficiency at a minimum.

It is another exemplary object of the present invention to provide a bonding method for a laminated piezoelectric element which is capable of prevent an adhesive agent from stripping.

Other objects of this invention will become clear as the description proceeds.

On describing the gist of a first exemplary aspect of this invention, it is possible to be understood that a method is of bonding an end surface of a laminated piezoelectric element in an expansion direction to a bonded surface of a bonded object using an adhesive agent. The laminated piezoelectric element includes a plurality of internal electrodes which are laminated in the expansion direction. The laminated piezoelectric element has a dead area at outer regions thereof. According to the first exemplary aspect of this invention, the method includes the steps of applying the adhesive agent to the end surface of the laminated piezoelectric element so as to avoid the dead area of the laminated piezoelectric element, and of bonding the end surface of the laminated piezoelectric element to the bonded surface of the bonded object.

On describing the gist of a second exemplary aspect of this invention, it is possible to be understood that a method is of bonding first and second end surfaces of a laminated piezoelectric element opposed to each other in an expansion direction to first and second bonded surfaces of first and second bonded objects using an adhesive agent, respectively. The laminated piezoelectric element includes a plurality of internal electrodes which are laminated in the expansion direction. The laminated piezoelectric element has a dead area at outer regions thereof. According to the second exemplary aspect of this invention, the method includes the steps of applying the adhesive agent to the first and the second end surfaces of the laminated piezoelectric element so as to avoid the dead area of the laminated piezoelectric element, and of bonding the first and the second end surfaces of the laminated piezoelectric element to the first and the second bonded surfaces of the first and the second bonded objects, respectively.

BRIEF DESCRIPTION OF THE DRAWINGS

FIG. 21A is a front view for use in a displacement amount of the laminated piezoelectric element by the related bonding method;

FIG. 21B is a cross sectional front view for use in a displacement amount of the laminated piezoelectric element by the bonding method according to this invention.

DESCRIPTION OF THE PREFERRED EMBODIMENTS

Figure 1:
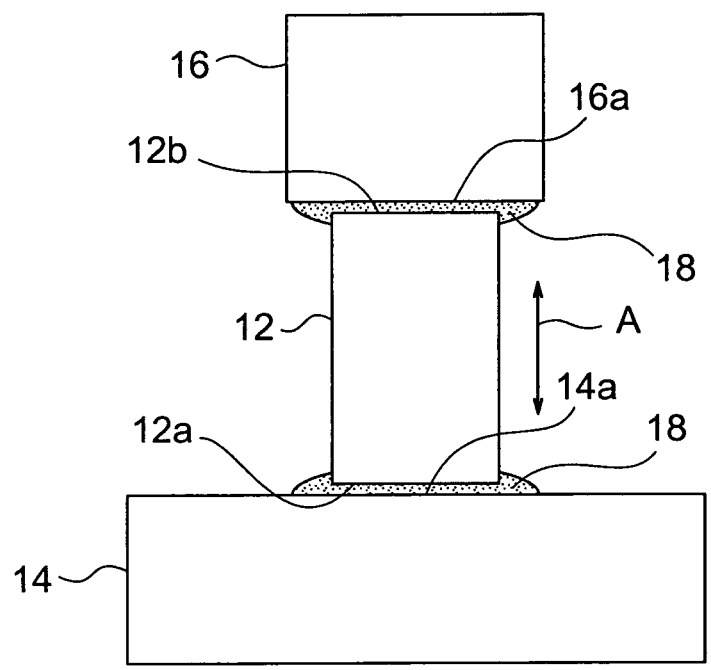
FIG. 1 is a schematic front view for use in describing a related bonding method for a laminated piezoelectric element.

Referring to FIG. 1, a related bonding method for a laminated piezoelectric element will be described at first in order to facilitate an understanding of the present invention.

The laminated piezoelectric element depicted at 12 has a lower end surface 12a and an upper end surface 12b which are opposed to each other in an expansion direction or a displacement direction thereof which is depicted at an arrow A. The lower end surface 12a is also called a first end surface while the upper end surface 12b is also called a second end surface.

It will be assumed that the lower end surface (the first end surface) 12a of the laminated piezoelectric element 12 should be bonded to a first bonded surface 14a of a housing 14 and the upper end surface (the second end surface) 12b of the laminated piezoelectric element 12 should be bonded to a second bonded surface 16a of a driving object 16. The housing 14 may comprise a supporting member, a supporting plate, or a weight fixing member. The driving object 16 may comprise a driving rod, a driving shaft, or a lens holder. The housing 14 and the driving object 16 are collectively called bonded objects.

Under the circumstances, in the related bonding method for the laminated piezoelectric element 12, the lower end surface (the first end surface) 12a of the laminated piezoelectric element 12 is uniformly bonded to the first bonded surface 14a of the housing 14 by means of an adhesive agent 18 and the upper end surface (the second end surface) 12b of the laminated piezoelectric element 12 is uniformly bonded to the second bonded surface 16a of the driving object 16 by means of the adhesive agent 18.

Figure 2A:
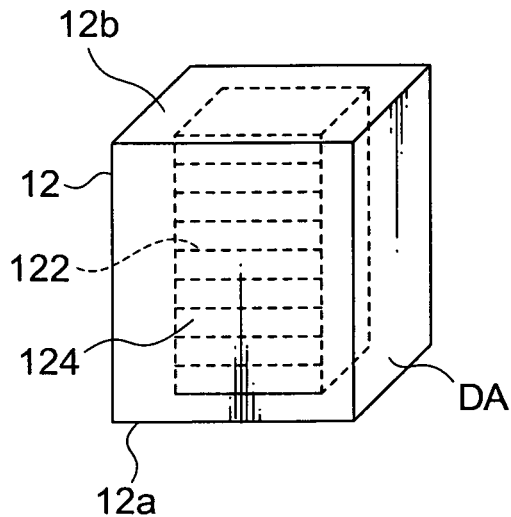
FIG. 2A is a schematic perspective view of a laminated piezoelectric element.
Figure 2B:
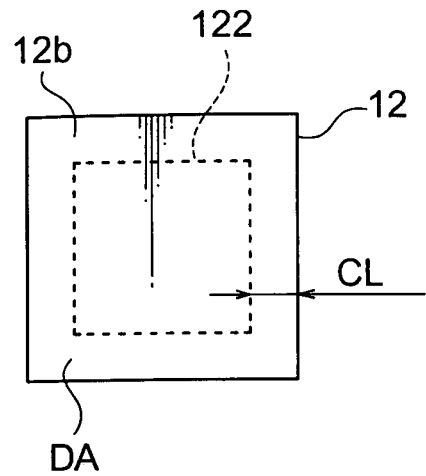
FIG. 2B is a schematic plan view of the laminated piezoelectric element.

Referring to FIGS. 2A and 2B, the description will proceed to the laminated piezoelectric element 12. FIG. 2A is a schematic perspective view of the laminated piezoelectric element 12. FIG. 2B is a schematic plan view of the laminated piezoelectric element 12.

As shown in FIG. 2A, the laminated piezoelectric element 12 has a structure of a pillar shape (or a rectangular parallelepiped shape). In addition, as shown in FIG. 2A, inside of the laminated piezoelectric element 12, internal electrodes 122 and piezoelectric materials 124 are alternately laminated. Each internal electrode 122 has a size which is smaller than the outside shape of the laminated piezoelectric element 12. A portion where the internal electrodes 122 are opposed to one another is a portion (an area) which contributes displacement of the laminated piezoelectric element 12.

For instance, it will be assumed that the laminated piezoelectric element 12 has the size of 0.9 mm×0.9 mm×1.5 mm. In this event, each internal electrode 122 has an effective size of 0.6 mm×0.6 mm. The piezoelectric material 124 is made of a material having a low Qm such as lead-zicronate-titanate (PZT). The laminated piezoelectric element 12 is manufactured by alternately laminating the piezoelectric materials 124 and the internal electrodes 122 in a com fashion by fifty layers. Each of the piezoelectric materials 124 has a thickness of 20 microns while each of the internal electrodes 122 has a thickness of 2 microns. On the other hand, a peripheral portion positioned the outside of the above-mentioned area (effective internal electrode) is a dead area DA which is operable so as to reduce a displacement generated by a electrode opposite portion.

Generally, in the laminated piezoelectric element 12, the larger a size of the internal electrode 122 is, the larger an area contributing the displacement is. As a result, an effective piezoelectric effect is obtained. However, if the internal electrodes 122 unnecessarily extend off to the outside surface because the size of each internal electrode 122 is too large, the voltage cannot be applied to the internal electrodes 122 due to an electric short circuit and the piezoelectric effect cannot be obtained. Thus, as shown in FIG. 2B, it is necessary to provide a clearance CL between the internal electrode 122 and the outer surface of the laminated piezoelectric element 12. In the example being illustrated, the clearance CL is equal to about 0.15 mm.

A camera used for a mobile mounted on a cellular telephone has been miniaturized year after year and a laminated piezoelectric element mounted in the camera has been also miniaturized about 1 mm square. Therefore, a function for reducing the displacement of the laminated piezoelectric element by the above-mentioned dead area DA (a portion of the clearance CL) cannot be negligible.

Figure 3A:
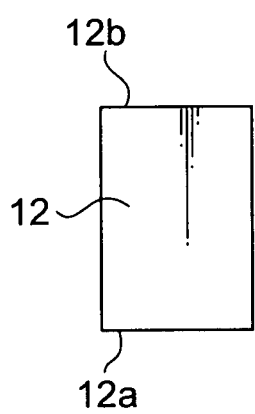
FIG. 3A is a front view showing an initial state of the laminated piezoelectric element.
Figure 3B:
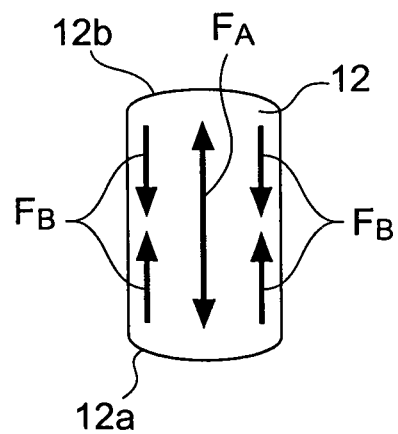
FIG. 3B is a front view showing a state where a voltage is applied to the laminated piezoelectric element.

Referring to FIGS. 3A and 3B, the description will proceed to this effect. FIG. 3A is a front view of the laminated piezoelectric element 12 having the rectangular parallelepiped shape in an initial state. FIG. 3B is a front view of the laminated piezoelectric element 12 having the rectangular parallelepiped shape when the voltage is applied to the internal electrodes of the laminated piezoelectric element 12.

As shown in FIG. 3B, when the voltage is applied to the internal electrodes 122 of the laminated piezoelectric element 12, a central portion where the internal electrodes 122 exist has the largest displacement while the dead area DA on the peripheral of the central portion has the smallest displacement. In other words, the central portion is acted upon by a force $F_A$ which makes the laminated piezoelectric element 12 deform while the dead area DA is acted upon by forces $F_B$ which decrease deformation of the laminated piezoelectric element 12.

For the laminated piezoelectric element 12 which deforms as shown in FIG. 3B, in related art, the lower and the upper end surfaces 12a and 12b of the laminated piezoelectric element 12 are uniformly bonded to the first and the second bonded surfaces 14a and 16a of the bonded subjects 14 and 16 by means of the adhesive agent 18 as shown in FIG. 1. In a case of such as a related bonding method, against a force for making the lower and the upper surfaces 12a and 12b of the laminated piezoelectric element 12 deform in a bow shape, a force of the adhesive agent 18 acts in a direction to inhibit this deformation. Accordingly, the maximum value of the displacement in this event is smaller than that of the laminated piezoelectric element 12 in a case where the lower and the upper surfaces 12a and 12b thereof are put into a free state without bonding as shown in FIG. 3B.

Inasmuch as, in the related bonding method as shown in FIG. 1, a stress acts on the adhesive agent (an adhesive portion) 18 on the displacement (expansion and contraction) of the laminated piezoelectric element 12, it is feared that the adhesive agent 18 peels from the bonded objects 14 and 16 or the lower and the upper end surfaces 12a and 12b of the laminated piezoelectric element 12, as mentioned in the preamble of the instant specification.

Figure 4:
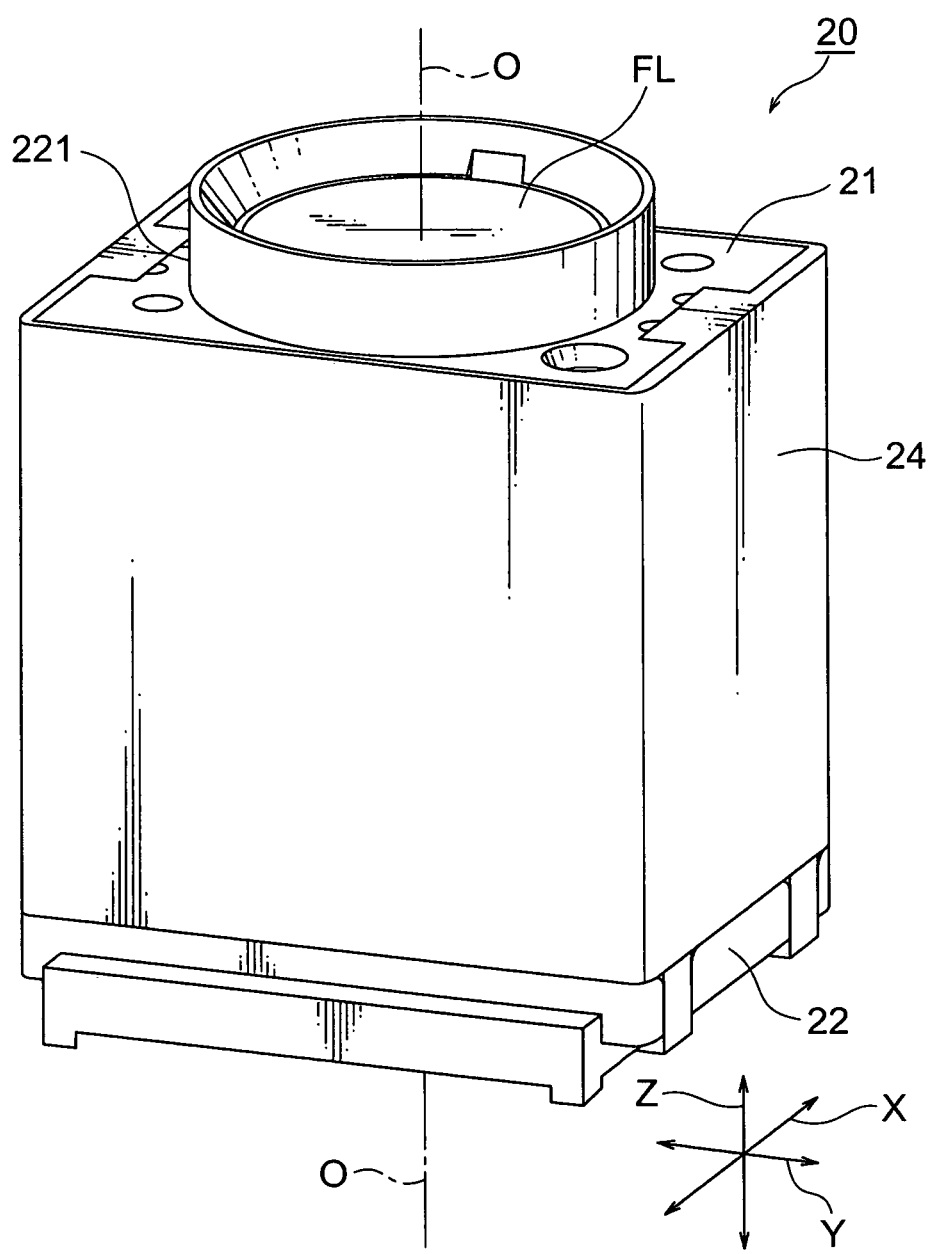
FIG. 4 is an external perspective view showing a linear actuator according an exemplary embodiment of this invention.

FIG. 4 is an external perspective view showing a linear actuator 20 according to an embodiment of this invention. Herein, an orthogonal coordinate system (X, Y, Z) is used as shown in FIG. 4. In a state illustrated in FIG. 1, in the orthogonal coordinate system (X, Y, Z), an X-axis direction is a fore-and-aft direction (a depth direction), a Y-axis direction is a left-and-right direction (a width direction), and a Z-axis direction is an up-and-down direction (a height direction). In addition, in the example being illustrated in FIG. 4, the up-and-down direction Z is a direction of an optical axis O of lenses.

The illustrated linear actuator 20 comprises a static member which comprises a first base portion 21 and a second base portion 22. The first and the second base portions 21 and 22 are disposed so that they are apart from each other in the direction of the optical axis O by a predetermined distance. In the example being illustrated, the first base portion 21 is disposed on an upper side in the up-and-down direction Z (the direction of the optical axis O) while the second base portion 22 is disposed on a lower side in the up-and-down direction Z (the direction of the optical axis O). Between the first base portion 21 and the second base portion 22, an outer cover 24 is provided. The outer cover 24 has a substantially rectangular barrel shape. Inside the outer cover 24, an actuator body (which will later be described) of the linear actuator 20 is mounted.

The first base portion 21 has a cylindrical portion 221 having a central axis which is the optical axis O. In the cylindrical portion 221, a first group fixed lens FL is fixedly disposed.

Although illustration is not made, the second base 22 had a central portion in which an image pickup device disposed on a substrate is mounted. The image pickup device picks up a subject image formed by the first group fixed lens FL, a second group lens (which will later be described), and a third group lens (which will later be described) to convert it into an electric signal. The image pickup device may, for example, comprise a CCD (charge coupled device) type image sensor, a CMOS (complementary metal oxide semiconductor) type image sensor, or the like.

Figure 5:
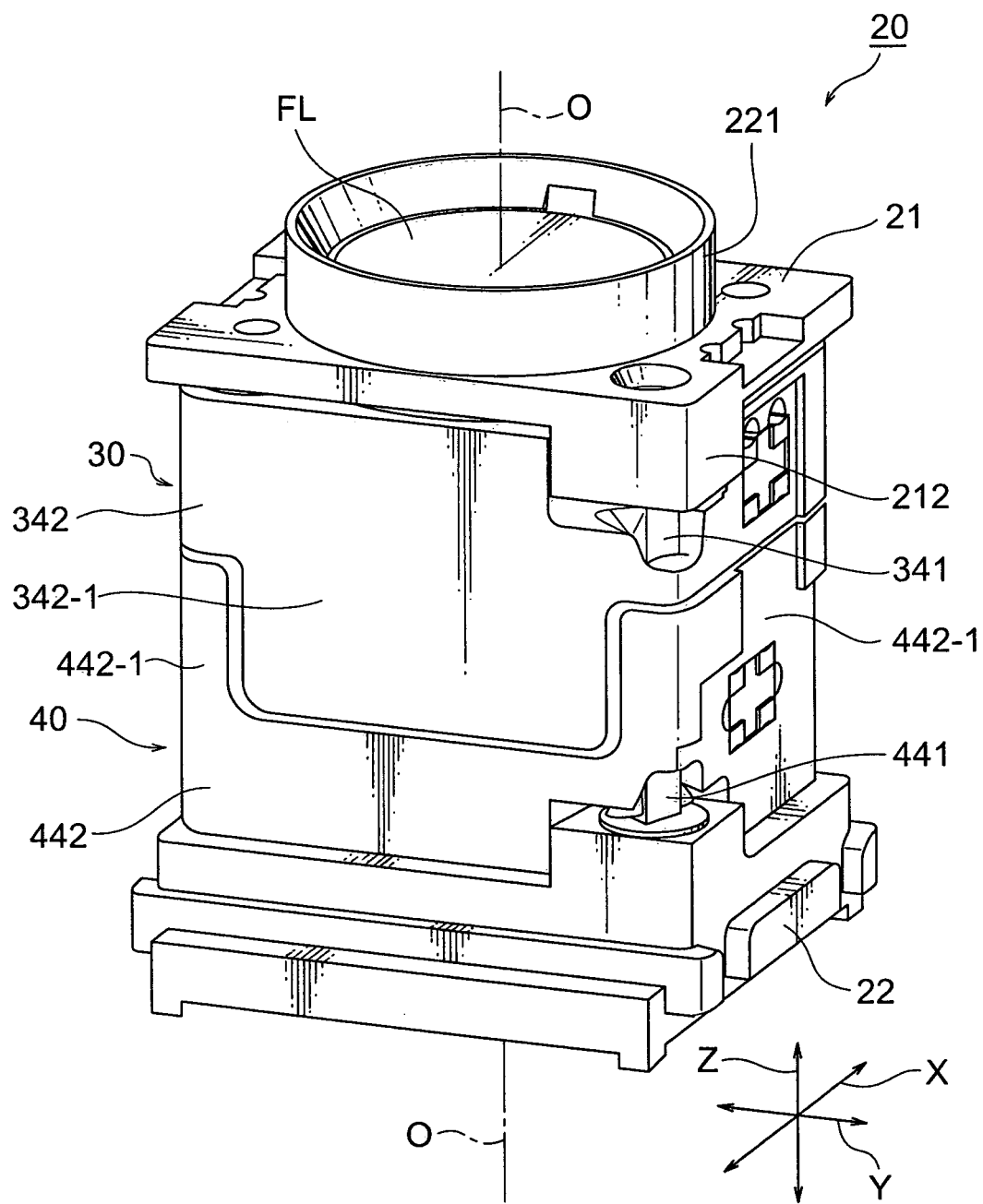
FIG. 5 is a perspective view of the linear actuator where an outer cover is removed from the linear actuator illustrated in FIG. 4.
Figure 6:
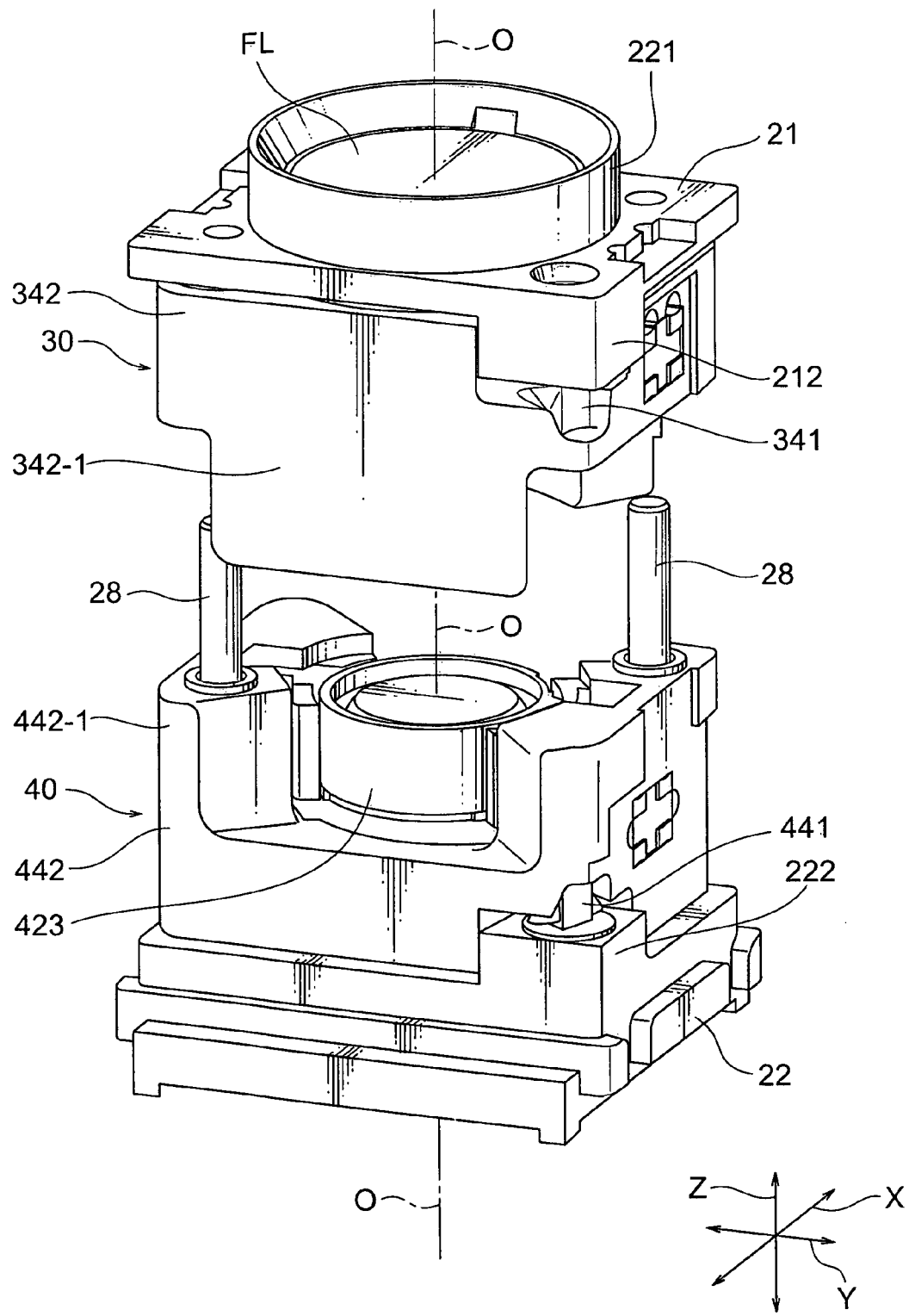
FIG. 6 is an exploded perspective view of the linear actuator illustrated in FIG. 5.

FIG. 5 is a perspective view of the linear actuator 20 with the outer cover 24 removed from the linear actuator 20 illustrated in FIG. 4. FIG. 6 is an exploded perspective view of the linear actuator 20 illustrated in FIG. 5.

As shown in FIGS. 5 and 6, the linear actuator 20 comprises a zoom lens driving unit 30 and an auto-focus lens driving unit 40. The zoom lens driving unit 30 is disposed to the first base portion 21 side while the auto-focus lend driving unit 40 is disposed to the second base portion 22 side. In other words, the zoom lens driving unit 30 is disposed in the upper side of the up-and-down direction Z (the direction of the optical axis O) while the auto-focus lens driving unit 40 is disposed in the lower side of the up-and-down direction Z (the direction of the optical axis O).

Herein, the zoom lens driving unit 30 will be also called a first driving unit while the auto-focus lens driving unit 40 will be also called a second driving unit. In the manner which will later be described, each of the zoom lens driving unit (the first driving unit) 30 and the auto-focus lens driving unit (the second driving unit) 40 has a substantially 2-fold rotational symmetrical structure which has the optical axis O as a 2-fold rotation axis.

The first base portion 21 comprises a pair of first protrusion portions 212 which project downwards along the up-and-down direction Z at two corners in a diagonal line direction having a center as the optical axis O. The second base portion 22 comprises a pair of second protrusion portions 222 which project upwards along the up-and-down direction Z at two corners in a diagonal line direction having the center as the optical axis O. In the manner which will later be described, the pair of first protrusion portions 212 is provided with a pair of first piezoelectric units 341 while the pair of second protrusion portions 222 is provided with a pair of second piezoelectric units 441.

As shown in FIG. 6, the static member comprises a pair of main shafts 28. The pair of main shafts 28 is disposed at rotational symmetrical positions about the optical axis O. The pair of main shafts 28 extends in parallel with each other between the first base portion 21 and the second base portion 22 in the direction of the optical axis O. The pair of main shafts 28 has one ends (upper ends) fixed to the first base portion 21 and other ends (lower ends) fixed to the second base portion 22.

In the example being illustrated, zoom lenses are called second group movable lenses (first lenses) while an auto-focus lens is called a third group movable lens (second lens). A combination of the zoom lens driving unit (the first driving unit) 30 and the first base portion 21 is called a second group lens driving mechanism (a first lens driving mechanism). A combination of the auto-focus lens driving unit (the second driving unit) 40 and the second base portion 22 is called a third group lens driving mechanism (a second lens driving mechanism).

Figure 7:
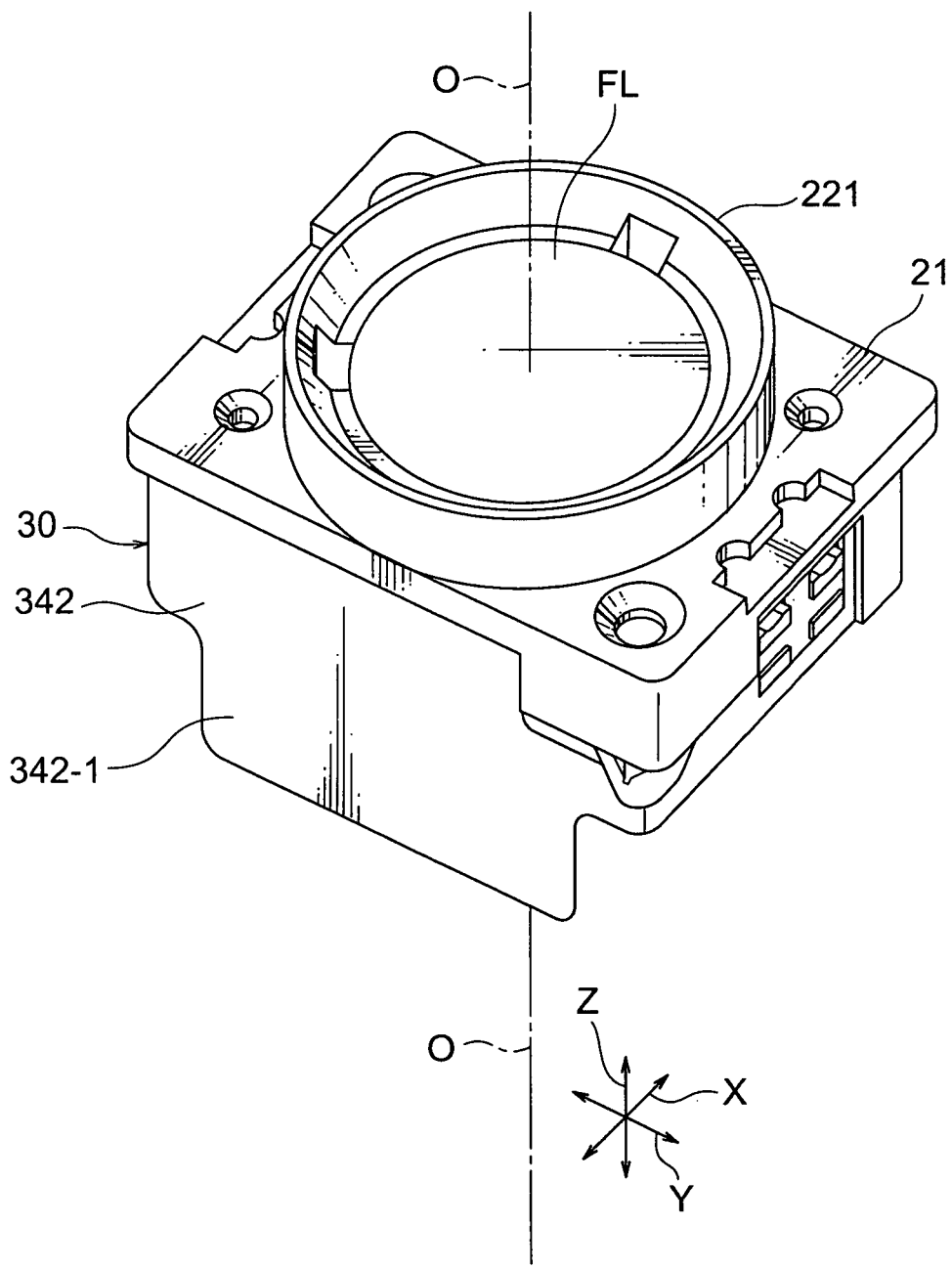
FIG. 7 is a perspective view of a second group lens driving mechanism (a first lens driving mechanism) for use in the linear actuator illustrated in FIG. 4.
Figure 8:
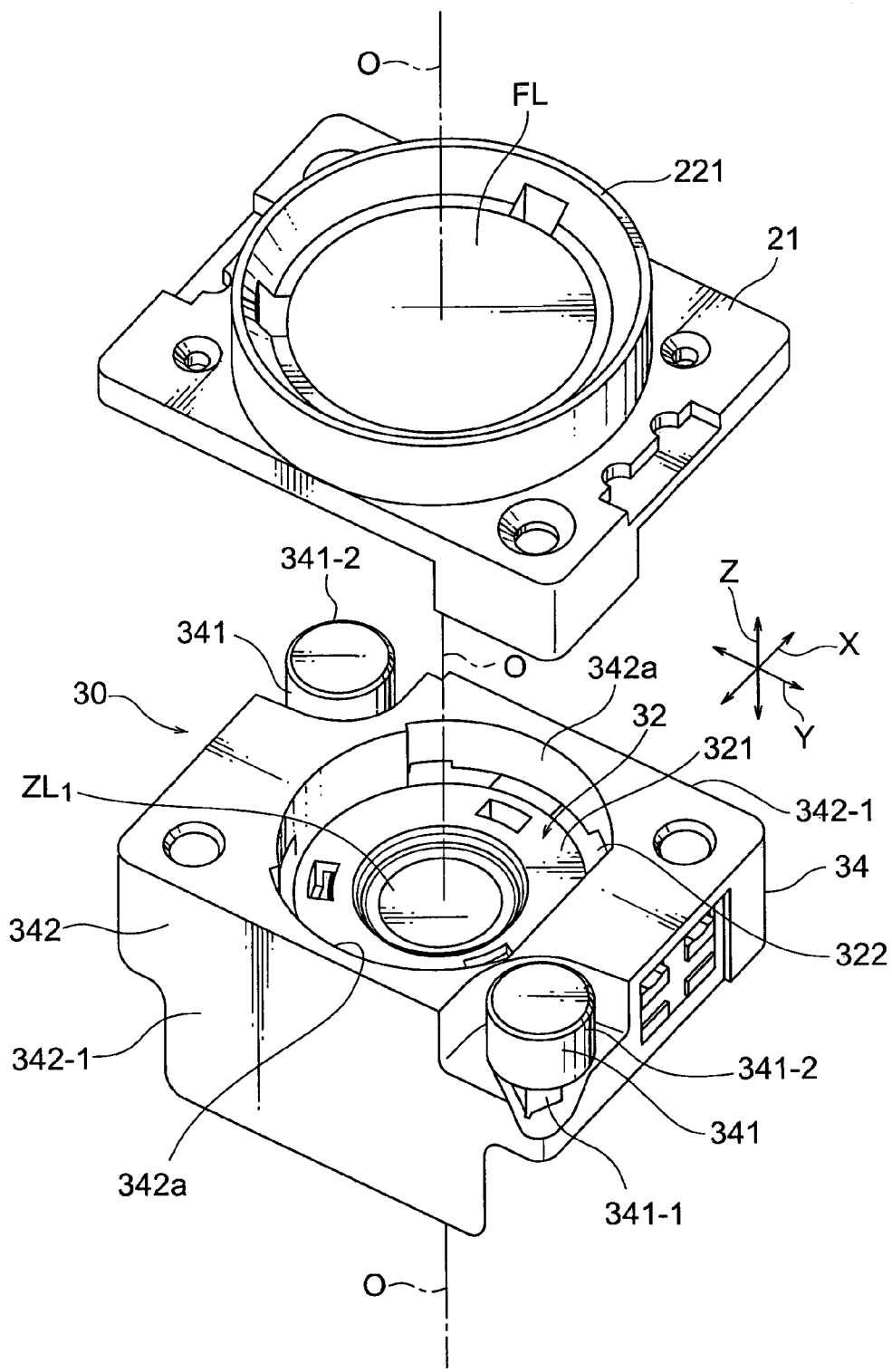
FIG. 8 is an exploded perspective view of the second group lens driving mechanism (the first lens driving mechanism) illustrated in FIG. 7.
Figure 9:
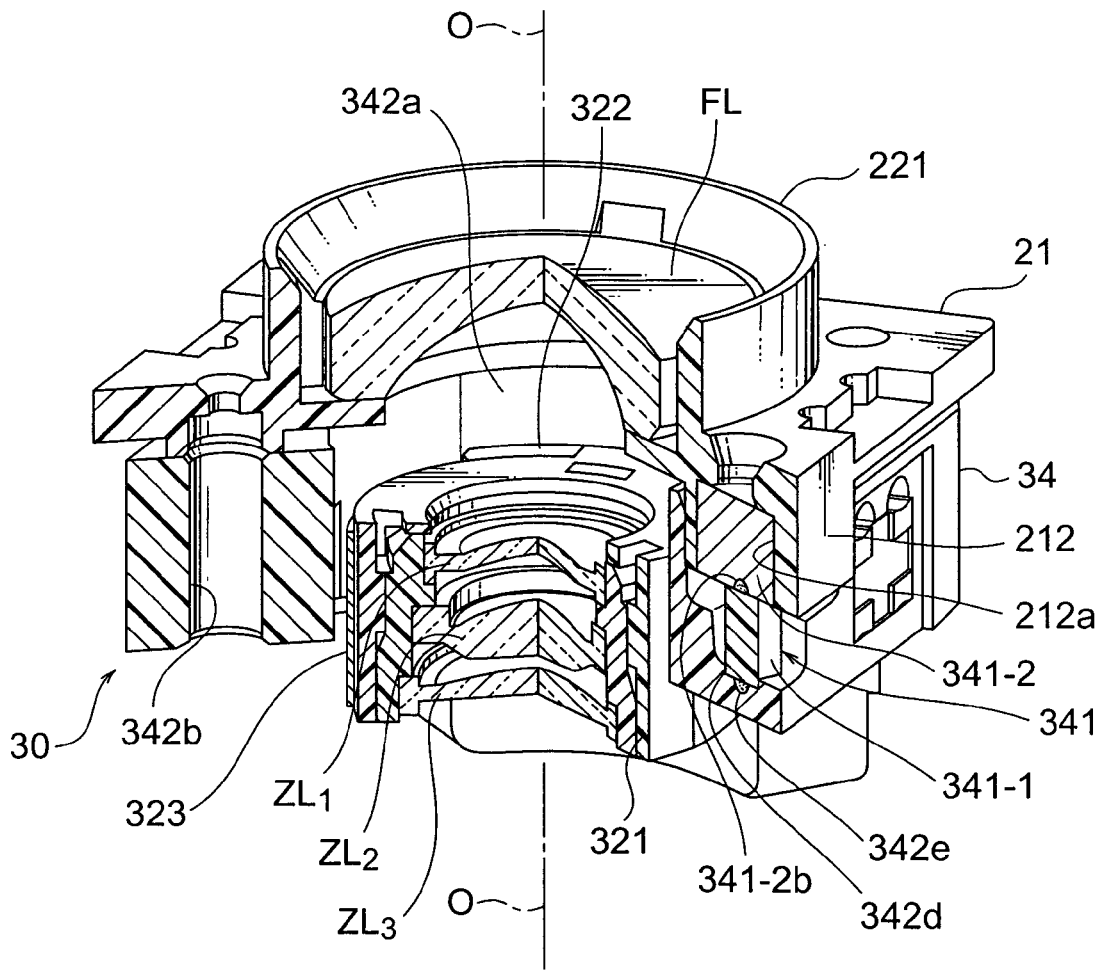
FIG. 9 is a partial cross sectional perspective view of the second group lens driving mechanism (the first lens driving mechanism) illustrated in FIG. 7.
Figure 9:
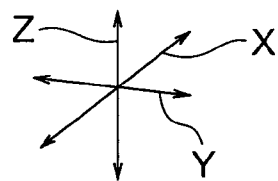

Referring to FIGS. 7 through 9, the description will proceed to the second group lens driving mechanism (the first lens driving mechanism). FIG. 7 is a perspective view of the second group lens driving mechanism (the first lens driving mechanism). FIG. 8 is an exploded perspective view of the second group lens driving mechanism (the first lens driving mechanism). FIG. 9 is a partial cross sectional perspective view of the second group lens driving mechanism (the first lens driving mechanism).

The zoom lens driving unit (the first driving unit) 30 comprises a first lens movable portion 32 and a first lens driving portion 34. The first lens movable portion 32 includes a first lens holder 321 for holding first through third zoom lenses (the second movable lenses) $ZL_1$, $ZL_2$, and $ZL_3$. The first lens holder 321 is movable related to the static member (the first base portion 21) in the direction of the optical axis O. The lens driving portion 34 slidably supports the lens movable portion 32 in the direction of the optical axis and drives the first lens movable portion 32 in the manner which will later be described.

The first driving portion 44 comprises the pair of first piezoelectric units 341 and a first vibration fiction portion 342. The pair of first piezoelectric units 341 is disposed at the rotational symmetrical positions about the optical axis O. The pair of first piezoelectric units 341 expands and contracts in the direction of the optical axis O. The pair of first piezoelectric units 341 has one ends in an expansion direction that are connected to the first base portion 21. The first vibration friction portion 342 is coupled to other ends of the pair of first piezoelectric units 341 in the expansion direction. The first vibration friction portion 342 is slidably disposed in the pair of main shafts 28.

The first vibration friction portion 342 comprises a pair of first side wall portions 342-1 which is disposed apart from each other in the fore-and-aft direction X at a rotational symmetrical positions around the optical axis O and which extends along the up-and-down direction Z. The pair of first side wall portions 341-1 has, as inner wall surfaces, a pair of first inner surfaces 342a for receiving or accommodating the first lens movable portion 32.

In addition, the first vibration friction portion 342 has a pair of first through holes 342b through which the pair of main shafts 29 passes. As a result of this, the first vibration friction portion 342 can vibrate only the direction of the optical axis O with rotation around the optical axis O restricted.

Each of the pair of first piezoelectric units 341 comprises a first laminated piezoelectric element 341-1 and a first piezoelectric element fixing portion 341-2. The first laminated piezoelectric element 341-1 comprises a plurality of piezoelectric layers which are laminated in the optical direction O. The first piezoelectric element fixing portion 341-2 has a first bonded surface 341-2a which is fixed to a first end surface (an upper end surface) 341-1a of the first laminated piezoelectric element 341-1 (see FIG. 19). The first piezoelectric element fixing portion 341-2 serves as a weight. The first piezoelectric element fixing portion 341-2 is fixed to the first base portion 21. The first laminated piezoelectric element 341-1 has a second end surface (a lower end surface) 341-1b which is coupled to a second bonded surface 342c of the first vibration friction portion 342 (see FIG. 19).

More specifically, as shown in FIG. 9, the pair of first protrusion portions 212 of the first base portion 21 has a pair of first cylindrical-shaped holes 212a in which the first piezoelectric element fixing portion (weight) 341-2 of the pair of first piezoelectric units 341 inserts. As a result of this, the first piezoelectric element fixing portion 341 is fixed to the first base portion 21. In addition, description will later be made as regards a connection between the first end surface (the upper end surface) 341-1a of the first laminated piezoelectric element 341-1 and the first bonded surface 341-2a of the first piezoelectric element fixing portion 341-2 and a connection between the second end surface (the lower end surface) 341-1b of the first laminated electric element 341-1 and the second bonded surface 342c of the first vibration friction portion 342 in detail.

The pair of first piezoelectric unit 341 and the first vibration friction portion 342 are disposed in parallel with each other related to the optical axis O, as shown in FIG. 8. Accordingly, it is possible to lower a height of the zoom lens driving unit (the first driving unit) 30. As a result, it is possible to lower also a height of the second group lens driving mechanism (the first lens driving mechanism).

Figure 10:
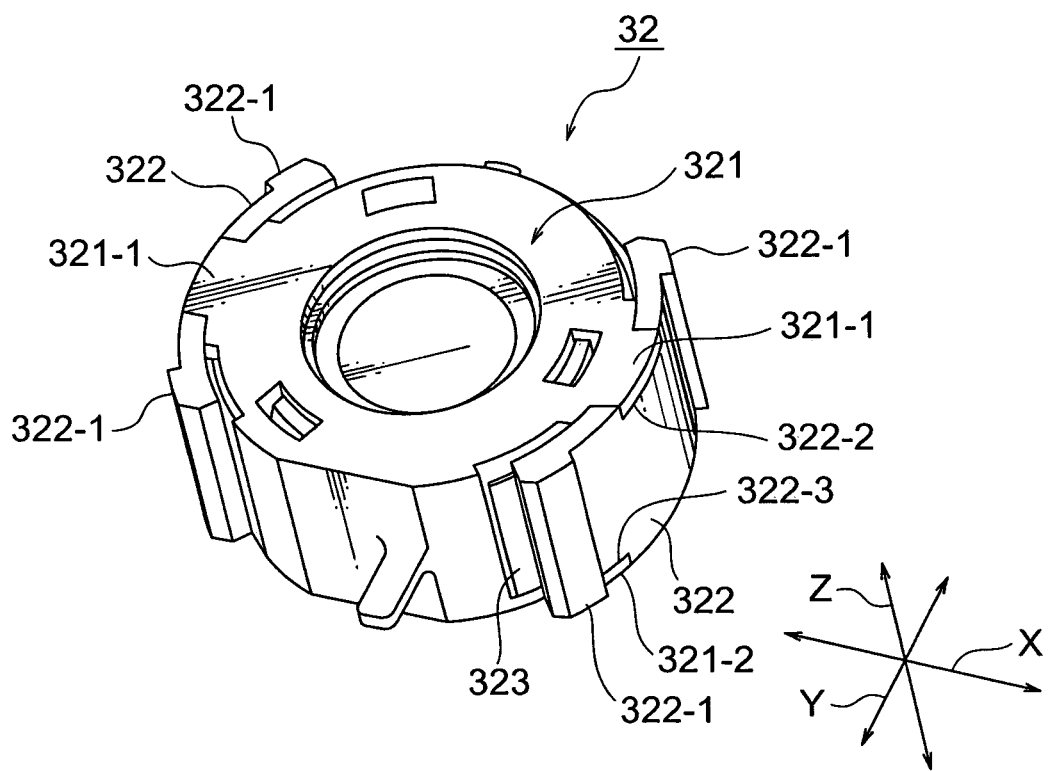
FIG. 10 is a perspective view of a first lens movable portion for use in the second group lens driving mechanism (the first lens driving mechanism) illustrated in FIG. 7.

Referring to FIG. 10 in addition to FIGS. 7 to 9, the first lens movable portion 32 includes a pair of first pads 322 which is disposed between the first lens holder 321 and the first inner surface 342a of the first vibration friction portion 342. The pair of first pads 322 is disposed apart from each other in the fore-and-aft direction X at rotational symmetrical positions around the optical axis O and is frictionally coupled to the pair of the first inner surfaces 342a of the first vibration friction portion 342. Specifically, each of the pair of first pats 322 has a pair of projection portions 322-1 which projects outwards in a radial direction at both end portions in the right-and-left direction Y. The pair of first projection portions 322-1 has contact surfaces which are in contact with the first inner surface 342a of the first vibration friction portion 342. That is, the first inner surface 342a of the first vibration friction portion 342 serves as a friction driving surface while the contact surfaces of the pair of first projection portions 322-1 serve as friction driven surfaces.

Between the pair of first pads 322 and the first lens holder 321, a first spring 323 is inserted. The first spring 323 has a ring shape with a notch. That is, by the first spring 323, the pair of first projection portions 322-1 of the pair of firs pads 322 are pressed against the first inner surface 342a of the first vibration friction portion 342. At any rate, the first spring 323 acts as a first urging arrangement for urging the pair of first pads 322 in the radial direction outwards.

Accordingly, it is possible to obtain a stable friction force until the pair of first projection portions 322-1 becomes lost. This is because the pair of first pads 322 is pushed out in the radial direction outwards by means of the first spring (the first urging arrangement) 323 although the friction driven surfaces (the contact surfaces of the pair of first projection portions 322-1) become worn.

In addition, the first lens holder 321 has a pair of first upper convex portions 321-1 and two pairs of first lower convex portions 321-2. The pair of first upper convex portions 321-1 projects from an upper end surface of the first lens holder 321 along the fore-and-aft direction X in the radial direction outwards. The two pairs of first lower convex portions 321-2 project from a lower surface portion of the first lens holder 321 in the radial direction outwards. On the other hand, each of the pair of first pads 322 has a first upper concave portion 322-2 at an upper end portion thereof and a pair of first lower concave portions 322-3 at a lower end portion thereof. The first upper concave portion 322-2 is fitted with the corresponding first upper convex portion 321-1. The pair of first lower concave portions 322-3 is fitted with the corresponding pair of first lower convex portions 321-2. As a result of this, positions of the pair of first pads 322 in the up-and-down direction Z (the direction of the optical axis O) and in a circumferential direction are restricted and the pair of first pads 322 is movable only in the radial direction outwards by means of first spring 323. At any rate, a combination of the pair of first upper convex portions 321-1 and the two pairs of first lower convex portions 321-2 of the first lens holder 321, and the first upper concave portion 322-2 and the pair of lower concave portions 322-3 of the pair of first pads 322 serves as a first position restricting arrangement for restricting the positions of the pair of first pads 322 in the direction of the optical axis O and in the circumferential direction.

In the manner which is described above, the first lens movable portion 32 experience a force from all around the first lens holder 321 in the direction of the optical axis O by means of the lens driving portion 34. Accordingly, the second group lens driving mechanism (the first lens driving mechanism) has a reasonable structure for driving a large weight object such as the first through the third zoom lenses $ZL_1$, $ZL_2$, and $ZL_3$. In addition, it is possible to reduce the inclination of the first through the third zoom lenses $ZL_1$, $ZL_2$, and $ZL_3$ during driving of the first lens movable portion 32 (the first lens holder 321).

Figure 11:
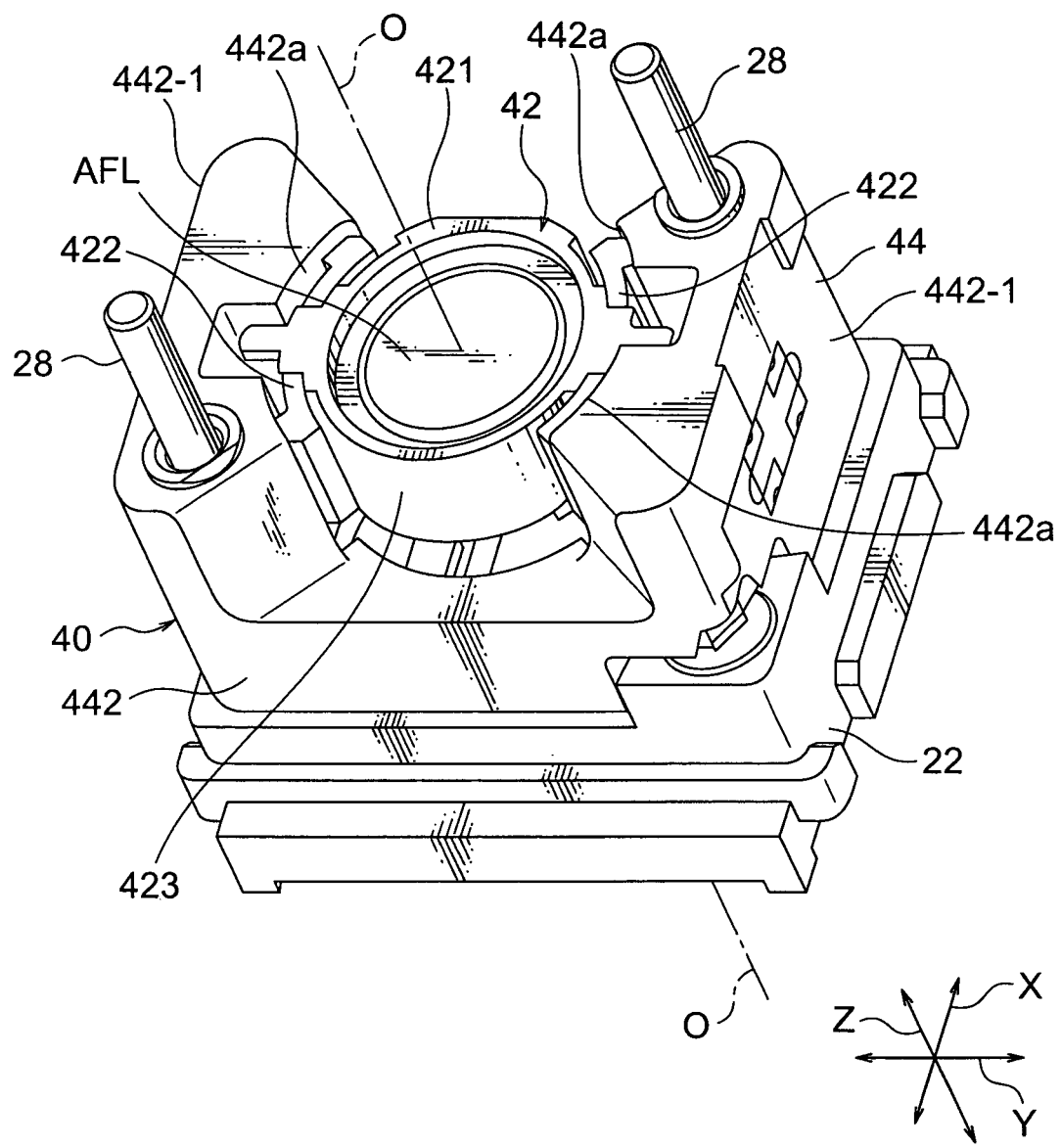
FIG. 11 is a perspective view of a third group lens driving mechanism (a second lens driving mechanism) for use in the linear actuator illustrated in FIG. 4.
Figure 12:
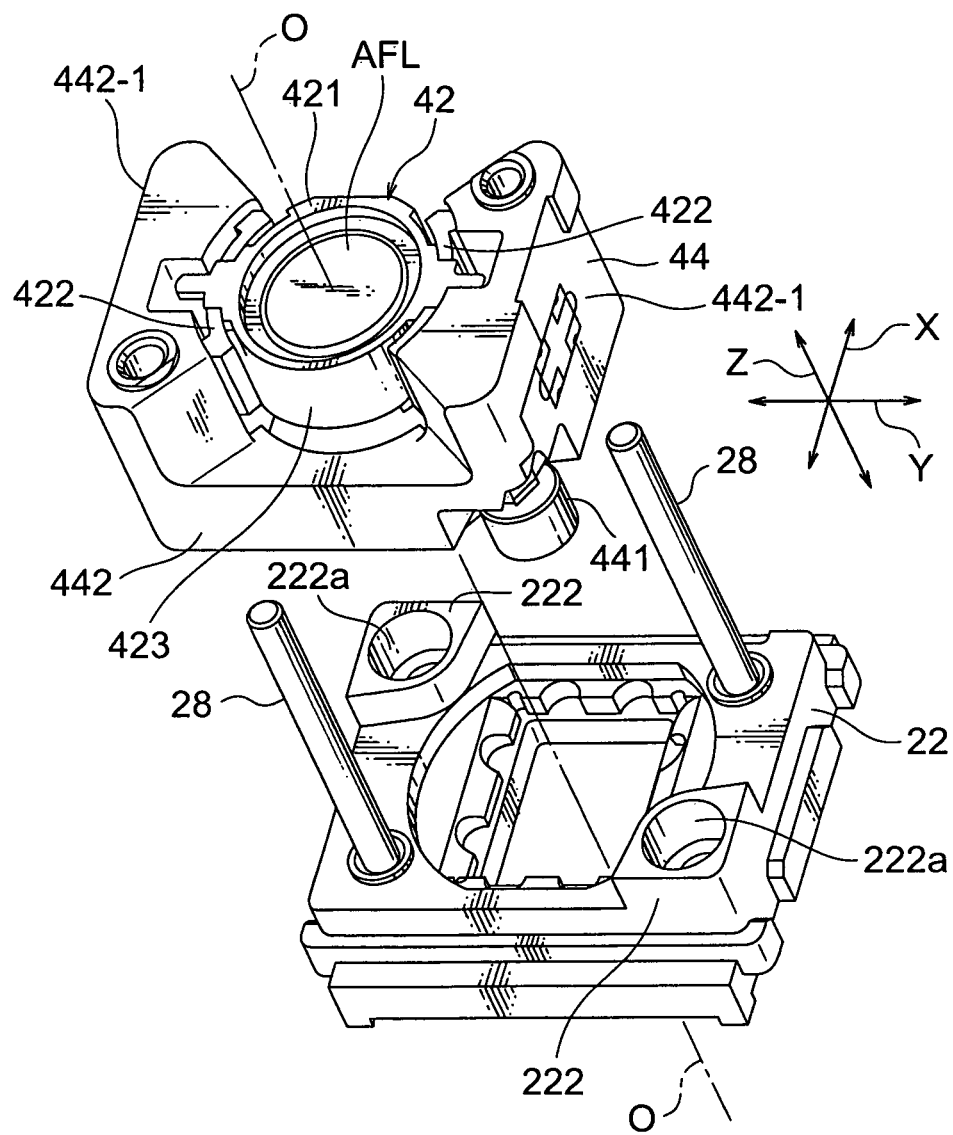
FIG. 12 is an exploded perspective view of the third group lens driving mechanism (the second lens driving mechanism) illustrated in FIG. 11.
Figure 13:
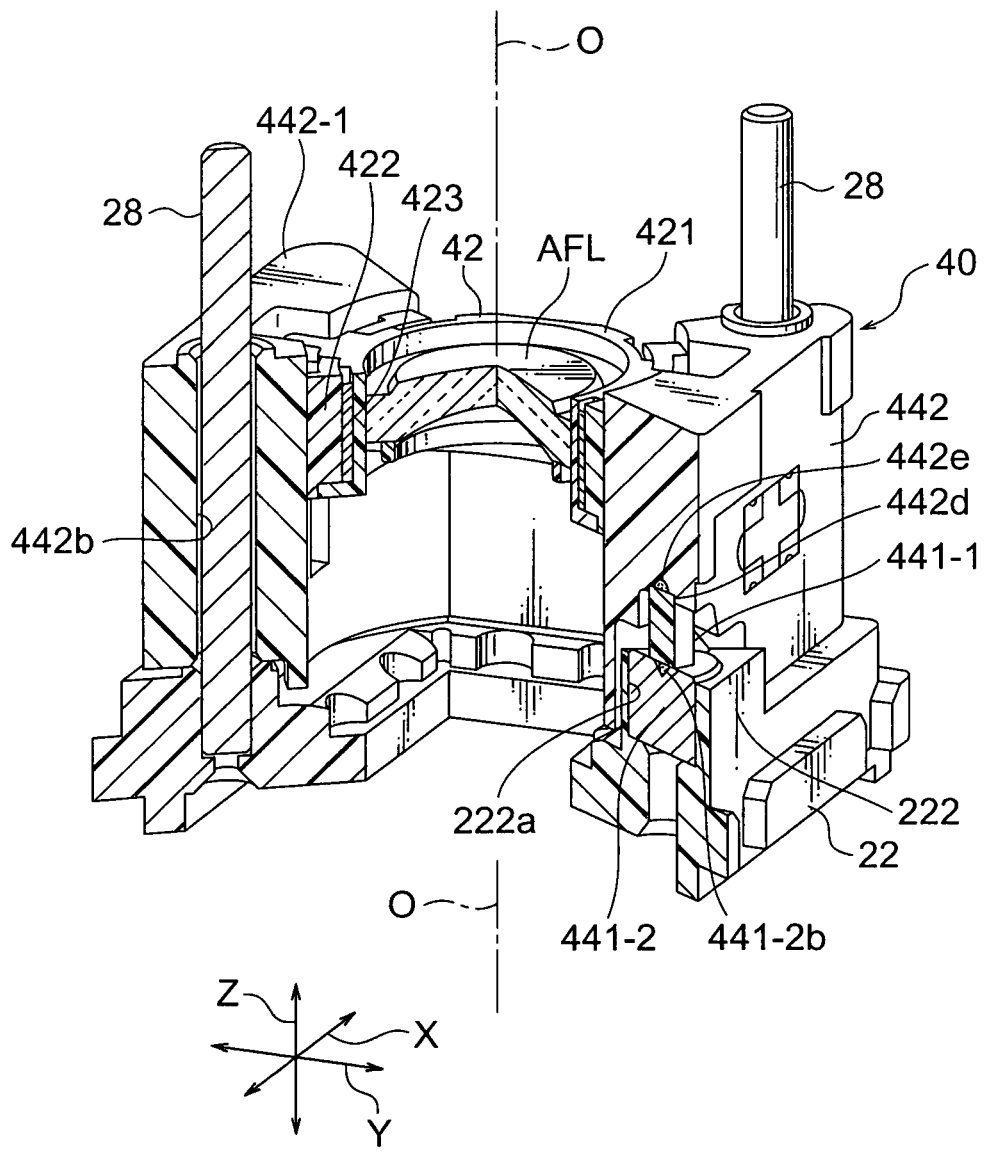
FIG. 13 is a partial cross sectional perspective view of the third group lens driving mechanism (the second lens driving mechanism) illustrated in FIG. 11.

Referring to FIGS. 11 though 13, the description will proceed to the third group lens driving mechanism (the second lens driving mechanism). FIG. 11 is a perspective view of the third group lens driving mechanism (the second lens driving mechanism). FIG. 12 is an exploded perspective view of the third group lens driving mechanism (the second lens driving mechanism). FIG. 13 is a partial cross sectional perspective view of the third group lens driving mechanism (the second lens driving mechanism).

The auto-focus lens driving unit (the second driving unit) 40 comprises a second lens movable portion 42 and a second lens driving portion 44. The second lens movable portion 42 includes a second lend holder 421 for holding an auto-focus lens (the third movable group lens) AFL. The lens holder 421 is movable to the static member (the second base portion 22) in the direction of the optical axis O. The second lens driving portion 44 slidably supports the second lens movable portion 42 in the direction of the optical axis O and drives the second lens movable portion 42 in the manner which will later be described.

The second lens driving portion 44 comprises a pair of second piezoelectric units 441 and a second vibration friction portion 442. The pair of second piezoelectric units 441 is disposed at rotational symmetrical positions around the optical direction O. The pair of second piezoelectric units 441 expands and contracts in the direction of the optical direction O. The pair of second piezoelectric units 441 has one ends in an expansion direction that are fixed to the second base portion 22. The second vibration friction portion 442 is coupled to other ends of the pair of second piezoelectric units 441 in the expansion direction. The second vibration friction portion 442 is slidably disposed to the pair of main shafts 28.

The second vibration friction portion 442 comprises a pair of second side wall portions 442-1 which is disposed apart from each other in the right-and-left direction Y at the rotational symmetrical positions around the optical axis O and which extends along the up-and-down direction Z. The pair of second side wall portions 442-1 has, as inner wall surfaces, a pair of inner second surfaces 442a for receiving or accommodating the second lens movable portion 42.

In addition, the second vibration friction portion 442 has a pair of second though holes 442b through which the pair of main shafts 28 is inserted. As a result of this, rotation of the second vibration friction portion 442 around the optical axis O is restricted and the second vibration friction portion 442 can vibrate only the direction of the optical axis O.

Each of the pair of second piezoelectric units 441 comprises a second laminated piezoelectric element 441-1 and a second piezoelectric element fixing portion 441-2. The second laminated piezoelectric element 441-1 comprises a plurality of piezoelectric layers which are laminated in the direction of the optical axis O. The second piezoelectric element fixing portion 441-2 has a first bonded surface 441-2a which is coupled to a first end surface (a lower end surface) 441-1a of the second laminated piezoelectric element 441-1 (see FIG. 20). The second piezoelectric element fixing portion 441-2 serves as a weight. The second piezoelectric element fixing portion 441-2 is fixed to the second base portion 22. The second laminated piezoelectric element 441-1 has a second end surface (an upper end surface) 441-1b which is coupled to a second bonded surface 442c of the second vibration friction portion 442 (see FIG. 20).

More specifically, as shown in FIG. 13, the pair of second protrusion portions 222 of the second base portion 22 has a pair of second cylindrical-shaped holes 222a through which the second piezoelectric element fixing portion (weight) 441-2 of the pair of second piezoelectric units 441 are inserted. As a result of this, the second piezoelectric element fixing portion 441-2 is fixed to the second base portion 22. In addition, the description will later be made as regards a connection between the first end surface (the lower end surface) 441-1a of the second laminated piezoelectric element 441-1 and the first bonded surface 441-2a of the second piezoelectric element fixing portion 441-2 and a connection between the second end surface (the upper end surface) 441-1b of the second laminated piezoelectric element 441-1 and the second bonded surface 442c of the second vibration friction portion 442 in detail.

The pair of second piezoelectric units 441 and the second vibration friction portion 442 are disposed in parallel with each other in the optical axis O as shown in FIG. 12. Accordingly, it is possible to lower a height of the auto-focus lens driving unit (the second driving unit) 40. As a result, it is possible to also lower a height of the third group lens driving mechanism (the second lens driving mechanism).

Figure 14:
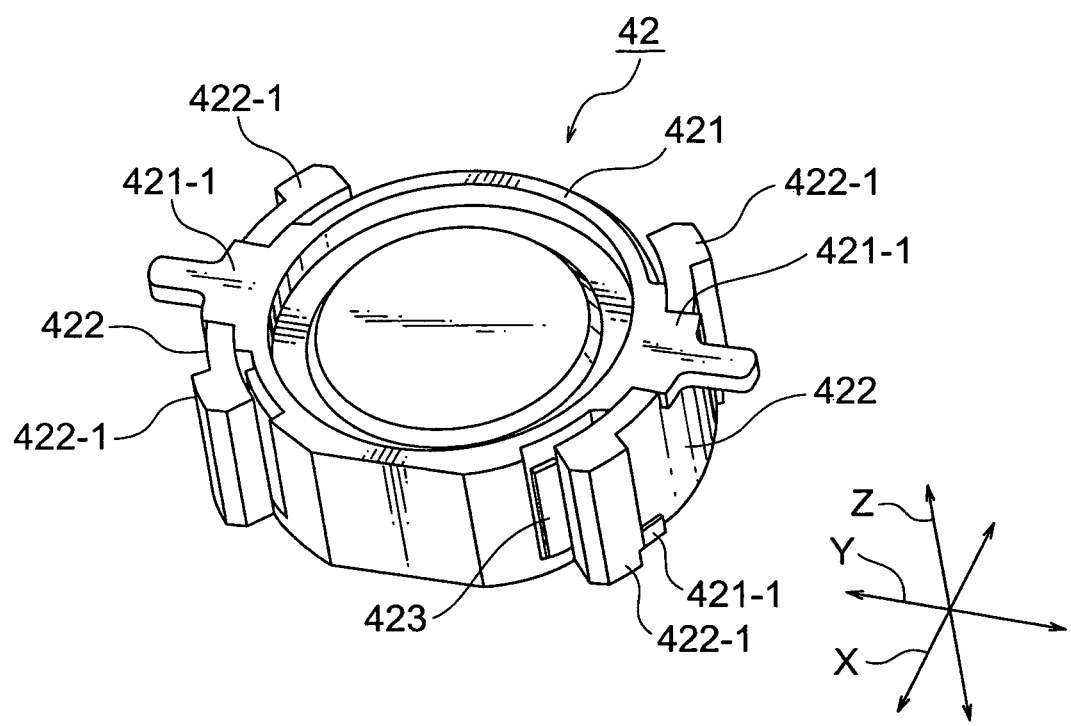
FIG. 14 is a perspective view of a second lens movable portion for use in the third group lens driving mechanism (the second lens driving mechanism) illustrated in FIG. 11.

Referring to FIG. 14 in addition to FIGS. 11 to 13, the second lens movable portion 42 includes a pair of second pads 422 which is disposed between the second lens holder 421 and the second inner surfaces 442a of the second vibration friction portion 442. The pair of second pads 442 is disposed apart from each other in the right-and-left direction Y at the rotational symmetrical positions around the optical axis O and frictionally couples to the pair of second inner surfaces 442a of the second vibration friction portion 442. More specifically, each of the pair of second pads 442 has a pair of projection portions 442-1 which projects at both end portions in the fore-and-aft direction X in a radial direction outwards. The pair of second projection portions 422-1 has contact surfaces which are in contact with the second inner surface 442a of the second vibration friction portion 442. That is, the second inner surface 442a of the second vibration friction portion 442 acts as a friction driving surface while the contact surfaces of the pair of second projection portions 442-1 act as friction driven surfaces.

Figure 15:
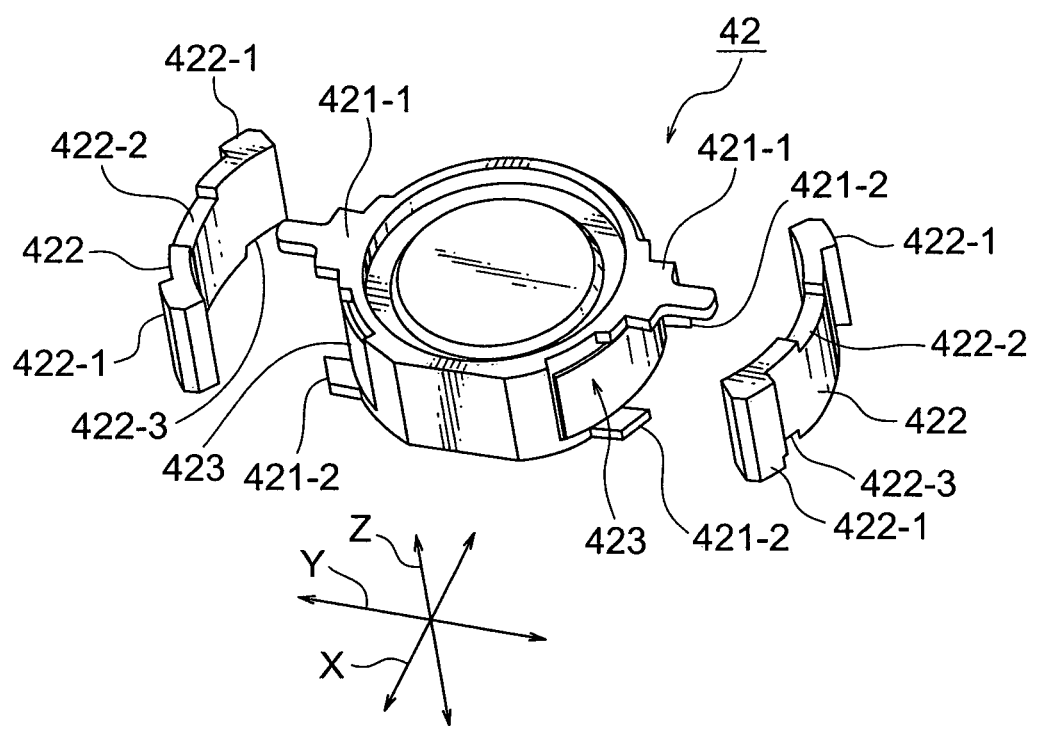
FIG. 15 is an exploded perspective view of the second lens movable portion illustrated in FIG. 14.
Figure 16:
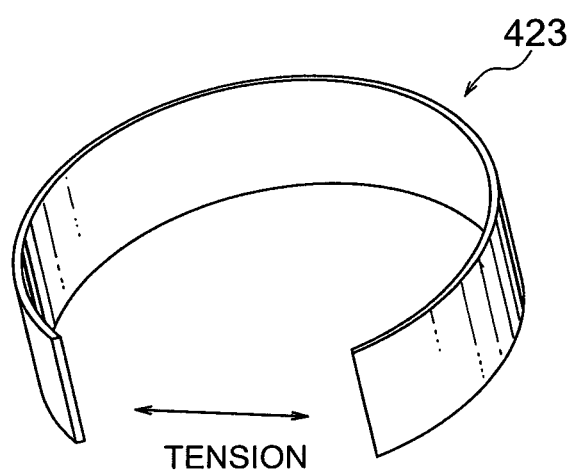
FIG. 16 is a perspective view of a second spring for use in the second lens movable portion illustrated in FIG. 15.

Referring to FIGS. 15 and 16 in addition to FIG. 14, between the pair of second pads 422 and the second holder 421, a second spring 423 is inserted. The second spring 423 has a ring shape with a notch. That is, by the second spring 324, the pair of second projection portions 422-1 of the pair of second pads 422 is pressed against the second inner surface 442a of the second vibration friction portion 442. At any rate, the second spring 423 serves as a second urging arrangement for urging the pair of second pads 422 in the radial direction outwardly.

Accordingly, it is possible to obtain a stable friction force until the pair of second projection portions 422-1 becomes lost. This is because the pair of second pads 422 is pushed out in the radial direction outwards by means of the second spring (the second urging arrangement) 423 although the friction driven surfaces (the contact surfaces of the pair of second projection portions 422-1) become worn.

In addition, the second lens holder 421 has a pair of upper convex portions 421-1 and two pairs of lower convex portions 421-2. The pair of upper convex portions 421-1 projects from an upper end surface of the second lens holder 421 along the right-and-left direction Y in the radial direction outwards. The two pairs of lower convex portions 421-2 project from a lower end surface of the second lens holder 421 in the radial direction outwards.

Figure 17:
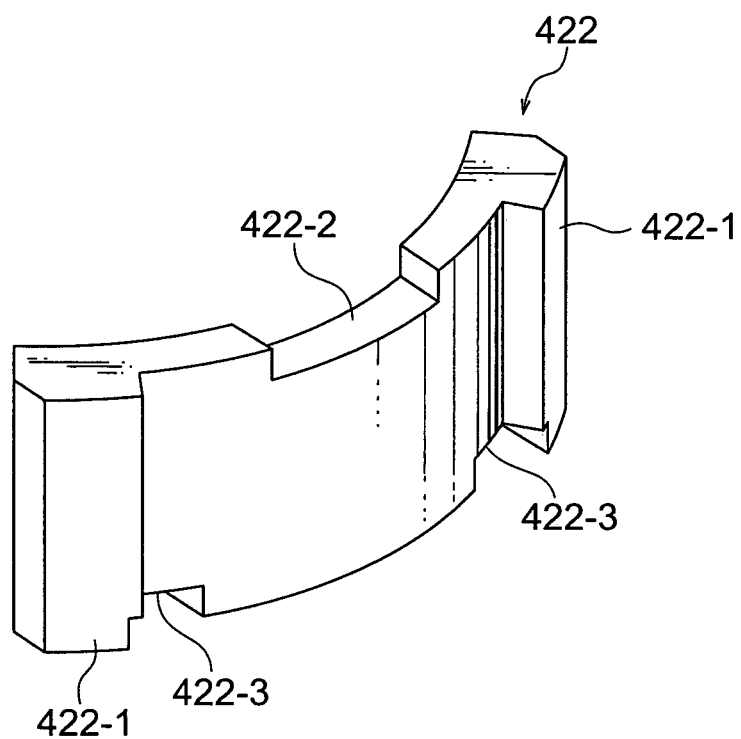
FIG. 17 is a perspective view of a second pad for use in the second lens movable portion illustrated in FIG. 15.

Referring to FIG. 17 also, each of the pair of second pads 422 has a second upper concave portion 422-2 at an upper end portion thereof and a pair of second lower concave portions 422-3 at a lower end portion thereof. The second upper concave portion 422-2 is fitted with the corresponding second upper convex portion 421-1. The pair of lower concave portions 422-3 are fitted with the corresponding pair of second lower convex portions 421-2. As a result of this, positions of the pair of second pads 422 in the up-and-down direction Z (the direction of the optical axis O) and a circumferential direction are restricted and the pair of second pads 422 is movable only in the radial direction outwards by means of the second spring 423. At any rate, a combination of the pair of second upper convex portions 421-1 and the two pairs of second lower convex portions 421-2 of the second lens holder 421, and the second upper concave portion 422-2 and the pair of second lower concave portions 422-3 of the pair of second pads 422 serves as a second position restricting arrangement for restricting the positions of the pair of second pads 422 in the direction of the optical axis O and the circumferential direction.

In the manner which is described above, the second lens movable portion 42 experiences a force from all around the second holder 421 in the direction of the optical axis O by means of the second lens driving portion 44. Accordingly, the third group lens driving mechanism (the second lens driving mechanism) has a reasonable structure for driving a large weight object such as the auto-focus lend AFL. In addition, it is possible to decrease the inclination of the auto-focus lens AFL during driving of the second lens movable portion 42 (the second lens holder 421).

In the manner which is shown in FIG. 5, on assembling these constituent elements, the first vibration friction portion 342 of the zoom lens driving unit (the first driving unit) 30 and the second vibration friction portion 442 of the auto-focus lens driving unit (the second driving unit) 40 are assembled in a state where a gap presents between them. Therefore, the first inner surface 342a of the first vibration friction portion 342 and the second inner surface 442a of the second vibration friction portion 442 are overlapped with each other in the direction of the optical axis O. As a result, a first movable range of the first lens movable portion 32 and a second movable range of the second lens movable portion 42 are overlapped with each other in the direction of the optical axis O. Accordingly, it is possible to lower a height of the linear actuator 20.

Figures 18A, 18B:
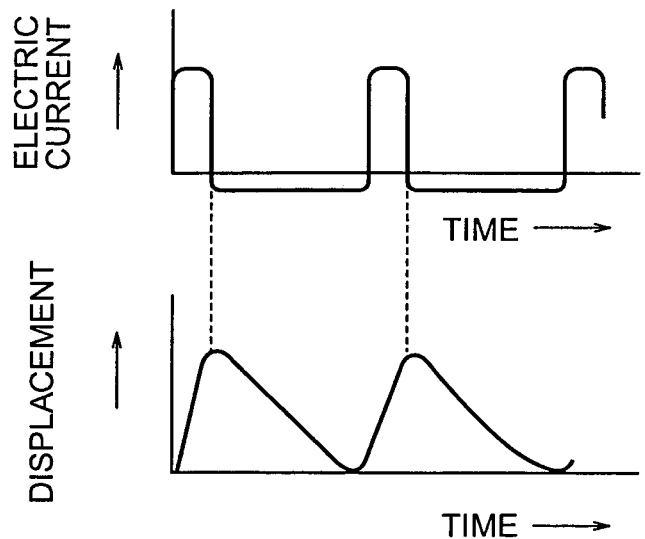
FIG. 18A is a waveform diagram for use in describing a current supplied to the laminated piezoelectric element.
FIG. 18B is a waveform diagram for use in describing displacements generated by the laminated piezoelectric element.

Referring now to FIGS. 18A and 18B, the description will proceed to an electric current supplied to the laminated piezoelectric element and displacements generated in the laminated piezoelectric element. FIGS. 18A and 18B are similar to those illustrated in FIG. 5 of the above-mentioned JP-B 3218851 (the second Patent Document) which corresponds to FIGS. 8(a) and 8(b) of U.S. Pat. No. 5,589,723. FIG. 18A shows a change of the electric current supplied to the laminated piezoelectric element by a driving circuit (not shown) and FIG. 18B shows the displacements of the laminated piezoelectric element.

As shown in FIG. 18A, a large current (in a positive or forward direction) and a constant current (in a negative or reverse direction) flow alternately through the laminated piezoelectric element. Under the circumstances, the laminated piezoelectric element produces alternately a rapid displacement (expansion) corresponding to the large current (positive or forward) and a slow displacement (contraction) corresponding to the constant current (negative or reverse), as shown in FIG. 18B.

That is, by applying a rectangular current to the laminated piezoelectric element (FIG. 18A), it makes the laminated piezoelectric element produce a sawtooth displacements (expansion and contraction) (FIG. 18B).

Referring to FIGS. 8 and 9 in addition to FIGS. 18A and 18B, the description will be made as regards operation of the zoom lens driving mechanism (the zoom lens driving unit 30). First, the description will presently be made as regards operation in a case where the first lens movable portion 32 moves along the up-and-down direction Z upwards.

It will now be assumed that the large current flows to the pair of first laminated piezoelectric elements 341-1 in the positive or forward direction as shown in FIG. 18A. In this event, the pair of first laminated piezoelectric element 341-1 rapidly produces the expansion displacement in the thickness direction as shown in FIG. 18B. As a result, the first vibration friction portion 342 rapidly moves along the direction of the optical axis O (the up-and-down direction Z) downwards. In this event, the first lens movable portion 32 does not moves. This is because, caused by the inertial force, the first lens movable portion 32 substantially remains in its position by overcoming the friction force between the first inner surface 342a of the first vibration friction portion 342 and the friction driven surfaces 322-1 of the pair of first pads 322.

Subsequently, it will be assumed that the constant current flows the pair of first laminated piezoelectric elements 341-1 in the negative or reverse direction as shown in FIG. 18A. In this event, the pair of first laminated piezoelectric element 341-1 slowly produces the contraction displacement in the thickness direction as shown in FIG. 18B. As a result, the first vibration friction portion 342 slowly moves along the direction of the optical axis O (the up-and-down direction Z) upwards. In this event, the first lens movably portion 32 substantially moves along the direction of the optical axis O (the up-and-down direction Z) upwards together with the first vibration friction portion 342. This is because the pair of first pads 322 is pushed in the radial direction by the first spring 323, the first inner surface 342a of the first vibration friction portion 342 and the friction driven surfaces 322-1 of the pair of first pads 322 come into surface contact with each other and are coupled to each other due to the friction force generating in the contact surfaces.

In the manner which is described above, by alternately flowing the large current (the positive or forward direction) and the constant current (the negative or reverse direction) through the pair of first laminated piezoelectric element 341-1 to make the pair of first laminated piezoelectric elements 341-1 alternately produce the expansion displacement and the contraction displacement, it is possible to continuously move the first lens holder 321 (the first lens movable portion 32) along the direction of the optical axis O (the up-and-down direction Z) upwards.

It will be assumed that it makes the first lens movable portion 32 along the direction of the optical axis O (the up-and-down direction Z) downwards. Conversely, this is obtained by alternately flowing the large current (the negative or reverse direction) and the constant current (the positive or forward direction) through the pair of first laminated piezoelectric elements 341-1.

Referring to FIGS. 12 and 13 in addition to FIGS. 18A and 18B, the description will be made as regards operation of the auto-focus lens driving mechanism (the auto-focus lens driving unit 40). First, the description will presently be made as regards operation in a case where the second lens movable portion 42 moves along the up-and-down direction Z downwards.

It will now be assumed that the large current flows to the pair of second laminated piezoelectric elements 441-1 in the positive or forward direction as shown in FIG. 18A. In this event, the pair of second laminated piezoelectric element 441-1 rapidly produces the expansion displacement in the thickness direction as shown in FIG. 18B. As a result, the second vibration friction portion 442 rapidly moves along the direction of the optical axis O (the up-and-down direction Z) upwards. In this event, the second lens movable portion 42 does not move. This is because, caused by the inertial force, the second lens movable portion 42 substantially remains in its position by overcoming the friction force between the second inner surface 442a of the second vibration friction portion 442 and the friction driven surfaces 422-1 of the pair of first pads 422.

Subsequently, it will be assumed that the constant current flows to the pair of second laminated piezoelectric elements 441-1 in the negative or reverse direction as shown in FIG. 18A. In this event, the pair of second laminated piezoelectric elements 441-1 slowly produces the contraction displacement in the thickness direction as shown in FIG. 18B. As a result, the second vibration friction portion 442 slowly moves along the direction of the optical axis O (the up-and-down direction Z) downwards. In this event, the second lens movably portion 34 substantially moves along the direction of the optical axis O (the up-and-down direction Z) downwards together with the second vibration friction portion 442. This is because the pair of second pads 422 is pushed in the radial direction by the second spring 423, the second inner surface 442a of the second vibration friction portion 442 and the friction driven surfaces 422-1 of the pair of second pads 422 come into surface contact with each other and are coupled to each other due to the friction force generating in the contact surfaces.

In the manner which is described above, by alternately flowing the large current (the positive or forward direction) and the constant current (the negative or reverse direction) through the pair of second laminated piezoelectric element 441-1 to make the pair of second laminated piezoelectric elements 441-1 alternately produce the expansion displacement and the contraction displacement, it is possible to continuously move the second lens holder 421 (the second lens movable portion 42) along the direction of the optical axis O (the up-and-down direction Z) downwards.

It will be assumed that it makes the second lens movable portion 42 along the direction of the optical axis O (the up-and-down direction Z) upwards. Conversely, this is obtained by alternately flowing the large current (the negative or reverse direction) and the constant current (the positive or forward direction) through the pair of second laminated piezoelectric elements 441-1.

Now, the description will proceed to the first laminated piezoelectric elements 341-1 for use in the first piezoelectric unit 341 and the second laminated piezoelectric elements 441-1 for use in the second piezoelectric unit 441.

The laminated piezoelectric element has a rectangular parallelepiped shape having an element size of 0.9 mm×0.9 mm×1.5 mm. The piezoelectric material is made of a material having a low Qm such as lead-zirconate-titanate (PZT). The laminated piezoelectric element is manufactured by alternately laminating the piezoelectric materials each having a thickness of 20 microns and the internal electrodes each having a thickness of 2 microns in a com fashion by fifty layers. In addition, the laminated piezoelectric element has the effective internal electrode size of 0.6 mm×0.6 mm. In other words, at a peripheral portion positioned the outside of the effective internal electrode of the laminated piezoelectric element, there is a ring-shaped dead area (clearance) of a width of 0.15 mm.

In the manner which will later be described in detail, this invention bonds the end surface of the laminated piezoelectric element to the bonded surface of the bonded object by means of an adhesive agent so as to avoid the above-mentioned dead area.

Figure 19:
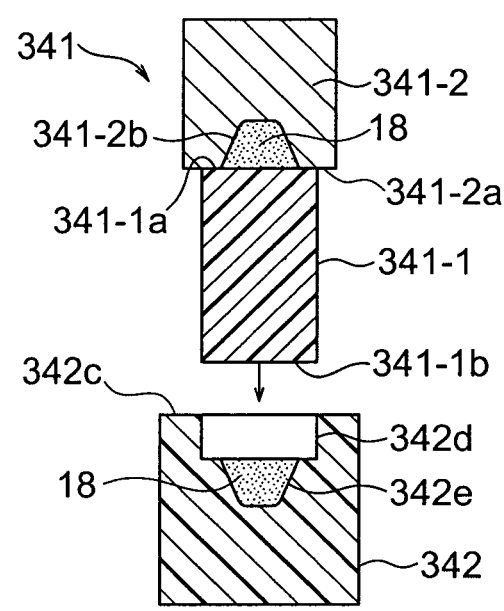
FIG. 19 is a cross sectional view for use in a bonding method between a first end surface of a first laminated piezoelectric element and a first piezoelectric element fixing portion and a bonding method between a second end surface of the first laminated piezoelectric element and a first vibration friction portion.

Referring now to FIG. 19 in addition to FIG. 9, the description will proceed to a method of bonding between the first end surface 341-1a of the first laminated piezoelectric element 341-1 and the first bonded surface 341-2a of the first piezoelectric element fixing portion 341-2 and a method of bonding between the second end surface 341-1b of the first laminated piezoelectric element 341-1 and the second bonded surface 342c of the first vibration friction portion 342.

The first piezoelectric element fixing portion 341-2 has, in the first bonded surface 341-2a, a first adhesive accumulation 341-2b having a size which is equivalent to the size of the internal electrodes 122 (FIG. 2A) of the first laminated piezoelectric element 341-1. Therefore, by means of an adhesive agent 18 accumulated in the first adhesive accumulation a 341-2b, the first end surface (the upper end surface) 341-1a of the first laminated piezoelectric element 341-1 is bonded to the first bonded surface 341-2a of the first piezoelectric element fixing portion 341-2. In other words, in bonding the first end surface (the upper end surface) 341-1a of the first laminated piezoelectric element 341-1 to the first bonded surface 341-2a of the first piezoelectric element fixing portion 341-2, the adhesive agent 18 is applied so as to avoid the dead area DA (FIG. 2A) of the first laminated piezoelectric element 341-1.

On the other hand, the first vibration friction portion 342 has, in the second bonded surface 342c, a first positioning guide hole 342d for guiding a position of the second end surface 341-1b of the first laminated piezoelectric element 341-1 and a second adhesive accumulation 342e having a size which is equivalent to the size of the internal electrodes 122 (FIG. 2A) of the first laminated piezoelectric element 341-1. Therefore, the second end surface 341-1b of the first laminated piezoelectric element 341-1 is positioned and guided along the first positioning guide hole 341d and the second end surface (the lower end surface) 341-1b of the first laminated piezoelectric element 341-1 is bonded to the first vibration friction portion 342 by means of the adhesive agent 18. In other words, in bonding the second end surface (the lower end surface) 341-1b of the first laminated piezoelectric element 341-1 to the second bonded surface 342c of the first vibration friction portion 342, the adhesive agent 18 is applied so as to avoid the dead area DA (FIG. 2A) of the first laminated piezoelectric element 341-1.

Figure 20:
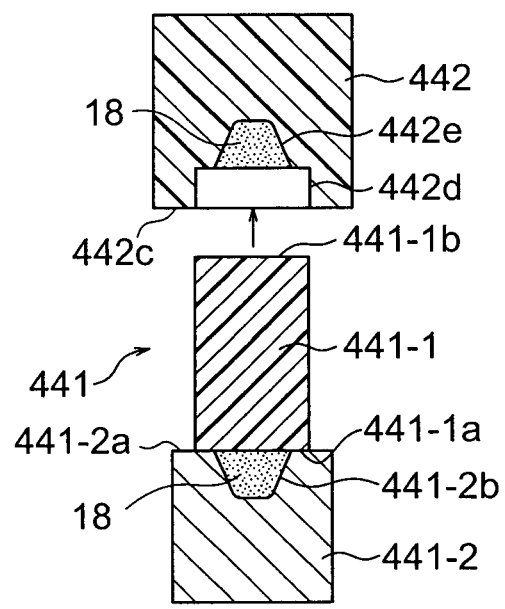
FIG. 20 is a cross sectional view for use in a bonding method between a first end surface of a second laminated piezoelectric element and a second piezoelectric element fixing portion and a bonding method between a second end surface of the second laminated piezoelectric element and a second vibration friction portion.

Referring now to FIG. 20 in addition to FIG. 13, the description will proceed to a method of bonding between the first end surface 441-1a of the second laminated piezoelectric element 441-1 and the first bonded surface 441-2a of the second piezoelectric element fixing portion 441-2 and a method of bonding between the second end surface 441-1b of the second laminated piezoelectric element 441-1 and the second bonded surface 442c of the second vibration friction portion 442.

The second piezoelectric element fixing portion 441-2 has, in the first bonded surface 441-2a, a third adhesive accumulation 441-2b having a size which is equivalent to the size of the internal electrodes 122 (FIG. 2A) of the second laminated piezoelectric element 441-1.

Therefore, by means of an adhesive agent 18 accumulated in the third adhesive accumulation 441-2b, the first end surface (the lower end surface) 441-1a of the second laminated piezoelectric element 441-1 is bonded to the first bonded surface 441-2a of the second piezoelectric element fixing portion 441-2. In other words, in bonding the first end surface (the lower end surface) 441-1a of the second laminated piezoelectric element 441-1 to the first bonded surface 441-2a of the second piezoelectric element fixing portion 441-2, the adhesive agent 18 is applied so as to avoid the dead area DA (FIG. 2A) of the second laminated piezoelectric element 441-1.

On the other hand, the second vibration friction portion 442 has, in the second bonded surface 442c, a second positioning guide hole 442d for guiding a position of the second end surface 441-1b of the second laminated piezoelectric element 441-1 and a fourth adhesive accumulation 442e having a size which is equivalent to the size of the internal electrodes 122 (FIG. 2A) of the second laminated piezoelectric element 441-1. Therefore, the second end surface 441-1b of the second laminated piezoelectric element 441-1 is positioned and guided along the second positioning guide hole 442d and the second end surface (the upper end surface) 441-1b of the second laminated piezoelectric element 441-1 is bonded to the second vibration friction portion 442. In other words, in bonding the second end surface (the upper end surface) 441-1b of the second laminated piezoelectric element 441-1 to the second bonded surface 442c of the second vibration friction portion 442, the adhesive agent 18 is applied so as to avoid the dead area DA (FIG. 2A) of the second laminated piezoelectric element 441-1.

In the manner which is described above, according to the embodiment of this invention, in bonding the upper and the lower end surfaces of the laminated piezoelectric element in the extraction direction to the bonded surfaces of the bonded objects, the adhesive agents are applied so as to avoid the dead area of the laminated piezoelectric element.

FIGS. 21A and 21B show displacement amounts of the laminated piezoelectric elements according to the related bonding method and the bonding method of this invention. FIG. 21A shows a displacement amount $D_1$ of the laminated piezoelectric element 12 according to the related bonding method while FIG. 21B shows another displacement amount $D_2$ of the laminated piezoelectric element 341-1 according to the bonding method of this invention.

In contradistinction between FIG. 21A and FIG. 21B, it is understood that the bonding method according to this invention where the adhesive agent 18 is applied to the end surface 341-1a of the laminated piezoelectric element 341-1 by avoiding the dead area DA can effectively ensure the displacement amount $D_2$ of the laminated piezoelectric element 341-1 in compared with the related bonding method where the adhesive agent 18 is uniformly applied to the end surface 12b of the laminated piezoelectric element 12. In other words, the bonding method according to this invention can obtain a larger displacement amount $D_2$ in comparison with the related bonding method when the voltage applied to the laminated piezoelectric element is similar. Concretely, when the displacement amount $D_2$ of the bonding method according to this invention is equal to about 90 nm, the displacement amount $D_1$ of the related bonding method is equal to about 50 nm.

As a result, in a case of moving the movable portion by the same distance, the actuator 20 using the bonding method according this invention can reduce power consumption in comparison with the actuator using the related bonding method. In addition, the bonding method according to this invention can prevent peeling in comparison with the related bonding method. This is because it is possible for the bonding method according to this invention to lessen the stress applied to the adhered portion.

Although the gist of the bonding method according to this invention is a method of applying the adhesive agent to the end surface of the laminated piezoelectric element by avoiding the dead area, as a matter of course, this invention is not limited to the above-mentioned embodiment.

Figure 22:
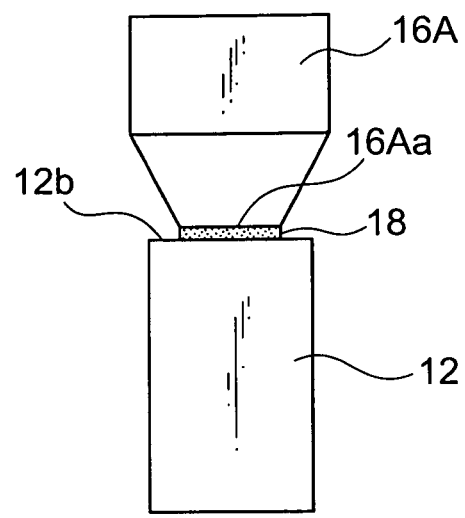
FIG. 22 is a front view for use in another bonding method according to this invention.

Referring to FIG. 22, the description will proceed to a bonding method of a second exemplary embodiment of this invention. A bonded object 16A has a bonded contact surface 16Aa having a size which is equivalent to the size of the internal electrodes 122 (see, FIGS. 2A and 2B) of the laminated piezoelectric element 12. With this structure, the adhesive agent 18 is applied to the end surface 12b of the laminated piezoelectric element 12 so as to avoid the dead area DA (see, FIGS. 2A and 2B).

In the first exemplary aspect of this invention, the applying step may comprise forming, in the bonded surface of the bonded object, an adhesive accumulation having a size which is equivalent to that of the internal electrodes of the laminated piezoelectric element, and accumulating the adhesive agent in the adhesive accumulation. Alternatively, the applying step may comprise forming, in the bonded surface of the bonded object, a positioning guide hole for guiding a position of the end surface of the laminated piezoelectric element and an adhesive accumulation having a size which is equivalent to that of the internal electrodes of the laminated piezoelectric element, and accumulating the adhesive agent in the adhesive accumulation. In place of this, the applying step may comprise forming the bonded surface of the bonded object so that the bonded surface has a size which is substantially equivalent to that of the internal electrodes, and applying the adhesive agent to the bonded surface of the bonded object.

In the second exemplary aspect of this invention, the first bonded object may comprise a piezoelectric element fixing portion for fixing the laminated piezoelectric element at the first bonded surface thereof. The second bonded object may comprise a vibration friction portion which coupled to the second end surface of said laminated piezoelectric element at the second bonded surface thereof. Under the circumstances, the above-mentioned applying step may comprise of forming, in the first bonded surface of the piezoelectric element fixing portion, a first adhesive accumulation having a size which is equivalent to that of the internal electrodes of the laminated piezoelectric element, of forming, in the second bonded surface of the vibration friction portion, a positioning guide hole for guiding a position of the second end surface of the laminated piezoelectric element and a second adhesive accumulation having a size which is equivalent to that of the internal electrodes of the laminated piezoelectric element, of accumulating the adhesive agent in the first adhesive accumulation, and of accumulating the adhesive agent in the second adhesive accumulation.

While this invention has been particularly shown and described with reference to exemplary embodiments thereof, the invention is not limited to these embodiments. It will be understood by those of ordinary skill in the art that various changes in form and details may be therein without departing from the spirit and scope of the present invention as defined by the claims. For example, although each of the zoom lens driving unit (the first driving unit) 30 and the auto-focus lens driving unit (the second driving unit) 40 has the substantially two-fold rotational symmetrical structure about the optical axis O as the two-fold rotation axis in the above-mentioned embodiment, each of the zoom lens driving unit (the first driving unit) and the auto-focus lens driving unit (the second driving unit) generally may have a substantially N-fold rotational symmetrical structure about the optical axis O as an N-fold rotation axis, where N represents an integer which is not less than two.

What is claimed is:

1. A method of bonding a flat end surface of a pillar-shaped laminated piezoelectric element in an expansion direction to a bonded surface of a bonded object using an adhesive agent in a state in which said laminated piezoelectric element is not displaced in the expansion direction, wherein said laminated piezoelectric element comprises a plurality of internal electrodes which are laminated in the expansion direction, wherein said laminated piezoelectric element has an effective area of the internal electrodes in which the internal electrodes are opposed to one another and has a dead area at outer regions thereof outside of the effective area of the internal electrodes, wherein the effective area of said internal electrodes is smaller than an outside shape of said laminated piezoelectric element, and wherein the flat end surface includes the effective area and the dead area, said method comprising:
applying said adhesive agent to the flat end surface of said laminated piezoelectric element at the effective area of the internal electrodes alone so as to avoid the dead area of said laminated piezoelectric element; and
bonding the flat end surface of said laminated piezoelectric element to the bonded surface of said bonded object,
wherein said applying comprises:
forming, in the bonded surface of said bonded object, a cavity having a size in a direction perpendicular to the expansion direction which is equivalent to that of the effective area of said internal electrodes of said laminated piezoelectric element; and
accumulating said adhesive agent in said cavity.

2. A method of bonding a flat end surface of a pillar-shaped laminated piezoelectric element in an expansion direction to a bonded surface of a bonded object using an adhesive agent in a state in which said laminated piezoelectric element is not displaced in the expansion direction, wherein said laminated piezoelectric element comprises a plurality of internal electrodes which are laminated in the expansion direction, wherein said laminated piezoelectric element has an effective area of the internal electrodes in which the internal electrodes are opposed to one another and has a dead area at outer regions thereof outside of the effective area of the internal electrodes, wherein the effective area of said internal electrodes is smaller than an outside shape of said laminated piezoelectric element, and wherein the flat end surface includes the effective area and the dead area, said method comprising:
applying said adhesive agent to the flat end surface of said laminated piezoelectric element at the effective area of the internal electrodes alone so as to avoid the dead area of said laminated piezoelectric element; and
bonding the flat end surface of said laminated piezoelectric element to the bonded surface of said bonded object,
wherein said applying comprises:
forming, in the bonded surface of said bonded object, a positioning guide hole for guiding a position of the flat end surface of said laminated piezoelectric element and a cavity having a size in a direction perpendicular to the expansion direction which is equivalent to that of the effective area of said internal electrodes of said laminated piezoelectric element; and
accumulating said adhesive agent in said cavity.

3. A method of bonding first and second flat end surfaces of a pillar-shaped laminated piezoelectric element opposed to each other in an expansion direction to first and second bonded surfaces of first and second bonded objects using an adhesive agent, respectively, in a state in which said laminated piezoelectric element is not displaced in the expansion direction, wherein said laminated piezoelectric element comprises a plurality of internal electrodes which are laminated in the expansion direction, and wherein said laminated piezoelectric element has an effective area of the internal electrodes, in which the internal electrodes are opposed to one another, and a dead area at outer regions thereof outside of the effective area of the internal electrodes of said laminated piezoelectric element, wherein the effective area of said internal electrodes is smaller than an outside shape of said laminated piezoelectric element, and wherein the first flat end surface and the second flat end surface include the effective area and the dead area, said method comprising:
applying said adhesive agent to the first and the second flat end surfaces of said laminated piezoelectric element at the effective area of the internal electrodes alone so as to avoid the dead area of said laminated piezoelectric element; and bonding the first and the second flat end surfaces of said laminated piezoelectric element to the first and the second bonded surfaces of said first and said second bonded objects, respectively, wherein said first bonded object comprises a piezoelectric element fixing portion for fixing said laminated piezoelectric element at the first bonded surface thereof, wherein said second bonded object comprises a vibration friction portion which is coupled to the second flat end surface of said laminated piezoelectric element at the second bonded surface thereof, and wherein said applying comprises:
 forming, in the first bonded surface of said piezoelectric element fixing portion, a first cavity having a size in a direction perpendicular to the expansion direction which is equivalent to that of the effective area of said internal electrodes of said laminated piezoelectric element;
 forming, in the second bonded surface of said vibration friction portion, a positioning guide hole for guiding a position of the second flat end surface of said laminated piezoelectric element and a second cavity having a size in a direction perpendicular to the expansion direction which is equivalent to that of the effective area of said internal electrodes of said laminated piezoelectric element;
 accumulating said adhesive agent in said first cavity; and
 accumulating said adhesive agent in said second cavity.

\* \* \* \* \*